US012656373B2

(12) United States Patent
Waldo et al.

(10) Patent No.: US 12,656,373 B2
(45) Date of Patent: Jun. 16, 2026

(54) AUTOMATIC DETERMINATION OF SPECTRUM AND SPECTROGRAM ATTRIBUTES IN A TEST AND MEASUREMENT INSTRUMENT

(71) Applicant: Tektronix, Inc., Beaverton, OR (US)

(72) Inventors: Gary J. Waldo, Hillsboro, OR (US); Alan Edward Wolke, Bound Brook, NJ (US); Barton T. Hickman, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 673 days.

(21) Appl. No.: 18/072,551

(22) Filed: Nov. 30, 2022

(65) Prior Publication Data

US 2023/0221352 A1 Jul. 13, 2023

Related U.S. Application Data

(60) Provisional application No. 63/299,392, filed on Jan. 13, 2022.

(51) Int. Cl.
  G01R 13/02 (2006.01)
  G06F 3/0481 (2022.01)
(52) U.S. Cl.
  CPC .......... G01R 13/029 (2013.01); G06F 3/0481 (2013.01)

(58) Field of Classification Search
  CPC ........................... G01R 13/029; G06F 3/0481
  See application file for complete search history.

(56) References Cited

U.S. PATENT DOCUMENTS

| | | | | |
|---|---|---|---|---|
| 6,434,515 | B1 * | 8/2002 | Qian | ..................... G06F 17/141 |
| | | | | 324/76.12 |
| 9,500,676 | B2 * | 11/2016 | Waldo | ................ G01R 13/0236 |
| 2006/0265218 | A1 * | 11/2006 | Samadani | ........... G10L 21/0208 |
| | | | | 704/233 |
| 2010/0194755 | A1 * | 8/2010 | Foo | ........................ G01R 13/02 |
| | | | | 345/440 |
| 2023/0186104 | A1 * | 6/2023 | Noble | ..................... G06F 18/40 |
| | | | | 706/15 |

* cited by examiner

*Primary Examiner* — Shelby A Turner
*Assistant Examiner* — Xiuqin Sun
(74) *Attorney, Agent, or Firm* — Miller Nash LLP; Andrew J. Harrington

(57) ABSTRACT

A test and measurement instrument includes a spectrogram generator for producing a first spectrogram image from an input signal, a display for showing the spectrogram image, and a user interface operating in conjunction with the display, the user interface including one or more user controllable inputs and the user interface configured to detect a user action, where the spectrogram generator is structured to produce a second spectrogram image, different from the first spectrogram image, based on the detected user action by the user interface. Methods of automatically generating spectrograms based on user actions are also described.

18 Claims, 16 Drawing Sheets

AUTOMATIC DETERMINATION OF SPECTRUM AND SPECTROGRAM ATTRIBUTES IN A TEST AND MEASUREMENT INSTRUMENT

CROSS-REFERENCE TO RELATED APPLICATIONS

This disclosure claims benefit of U.S. Provisional Application No. 63/299,392, titled "AUTOMATIC DETERMINATION OF SPECTRUM AND SPECTROGRAM ATTRIBUTES IN A TEST AND MEASUREMENT INSTRUMENT," filed on Jan. 13, 2022, the disclosure of which is incorporated herein by reference in its entirety.

TECHNICAL FIELD

This disclosure relates to test and measurement instruments, and more particularly to a user interface for a test and measurement instrument.

DESCRIPTION

Test and measurement instruments, such as oscilloscopes and spectrum analyzers, among others, measure characteristics of input signals being tested or measured and display them to a user, so that a user can visualize and inspect signal characteristics of interest. Measurements include signal characteristics in the time domain, such as voltage or current, and also in the frequency domain, such as spectral energy or power. Spectrograms are graphic displays that illustrate a specific type of frequency content, i.e., spectral content, of a signal or signals as they change over time. In general, a spectrogram is a collection of individual spectral traces from a waveform sample that are collected and processed over time, concatenated with one another to produce a single image, and then presented at an orthogonal angle from the original spectrum traces to allow the user to visualize particular characteristics or qualities of the input waveform as it changes over time. Generation of spectrograms is described in more detail below.

Working with spectrograms may be confusing for users, as even very sophisticated users of modern test and measurement instruments may not fully understand how spectrograms are generated by the instrument. More specifically, although an instrument may include controls for modifying parameters used to generate the spectrograms, modifying such controls may produce unexpected results in the resultant spectrogram, leading to user confusion, frustration, and potentially dissatisfaction with the instrument. Furthermore, instruments lack intuitive controls that allow a user to generate specific spectrograms of particular portions of an input waveform. In other words, many instruments generate a single spectrogram for an entire input waveform sample, or acquisition, but the user may wish to evaluate only a relatively small amount of the waveform acquisition. Coordinating spectrogram content with that of a particular portion of an acquisition is impossible in many instruments, and, even for those instruments where such coordination is possible, it is non-intuitive, and instead requires sophisticated manual setup to achieve the desired coordination.

Embodiments according to this disclosure address these and other limitations in the field of test and measurement instruments.

DETAILED DESCRIPTION

Figure 1:
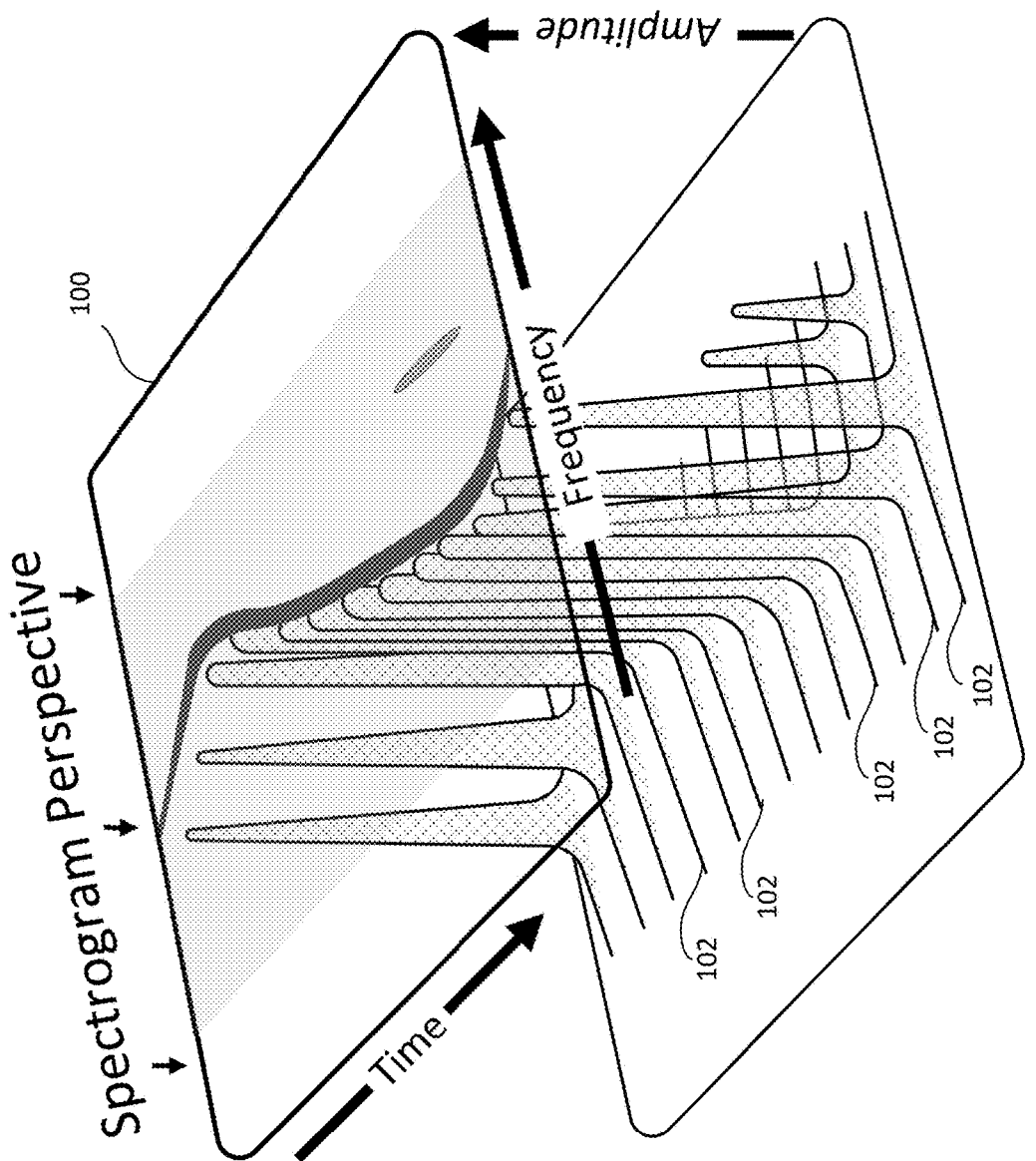
FIG. 1 is an illustration of how spectrograms of the type operated on by embodiments of the disclosure are produced.

As described above, spectrograms are graphic displays that illustrate spectral content of a signal or signals as they change over time. As illustrated in FIG. 1, a spectrogram 100 is a graphic image produced by generating a series of individual spectrum traces 102, concatenating the spectrum traces together, and then presenting the concatenated spectrum traces at an orthogonal angle from the original spectrum traces to allow the user to visualize particular characteristics or qualities of the input waveform as it changes over time. As illustrated in FIG. 1, each series of spectrum traces 102 spans a pre-defined frequency span, where the amplitude of the trace indicates received signal strength, i.e., power, for each of the individual frequencies covered in the span. Each individual spectrum trace represents the input signal strength captured over a period of time. After the first spectrum trace is generated, a subsequent trace is generated. If the input signal has changed between the time the first and second spectrum traces are generated, the second spectrum trace will vary from the first spectrum trace. The spectrogram combines all of the generated spectrum traces 102 with one another as they are produced over time, where time is represented on the Y-axis of the spectrogram and frequency is represented on the X-axis of the spectrogram. When the newest spectrum traces appear at the top of the spectrogram image, it is referred to as a waterfall display spectrogram. Instead, when the oldest spectrum traces appear at the top of the spectrogram image, it is referred to as a reverse-waterfall configuration. The spectrogram itself is the view from the 'top' of this generated image, referred to in FIG. 1 as the spectrogram perspective. The spectrogram may be color coded to represent the amplitude or magnitude variations across the frequency span of the spectrum trace. With such a spectrogram image, the user may observe the static, dynamic, and transient nature of the spectral activity of the signal being analyzed. Although spectrograms produced by instruments are typically shown in color, the spectrogram of FIG. 1 is in greyscale, where darker portions of the spectrogram represent higher amplitudes or magnitudes.

Spectrograms may be discontinuous or continuous. Discontinuous spectrograms may include time gaps where certain portions of the spectrum slices of the input signal are not generated due to factors such as processing limitations of an instrument, trigger intervals, bandwidth settings, and acquisition length of the input signal, among others. Continuous spectrograms are constructed from a single, continuous waveform acquisition of the input signal in instruments where an acquisition length of the input signal exceeds the amount of the spectrum being analyzed.

Figures 2, 3:
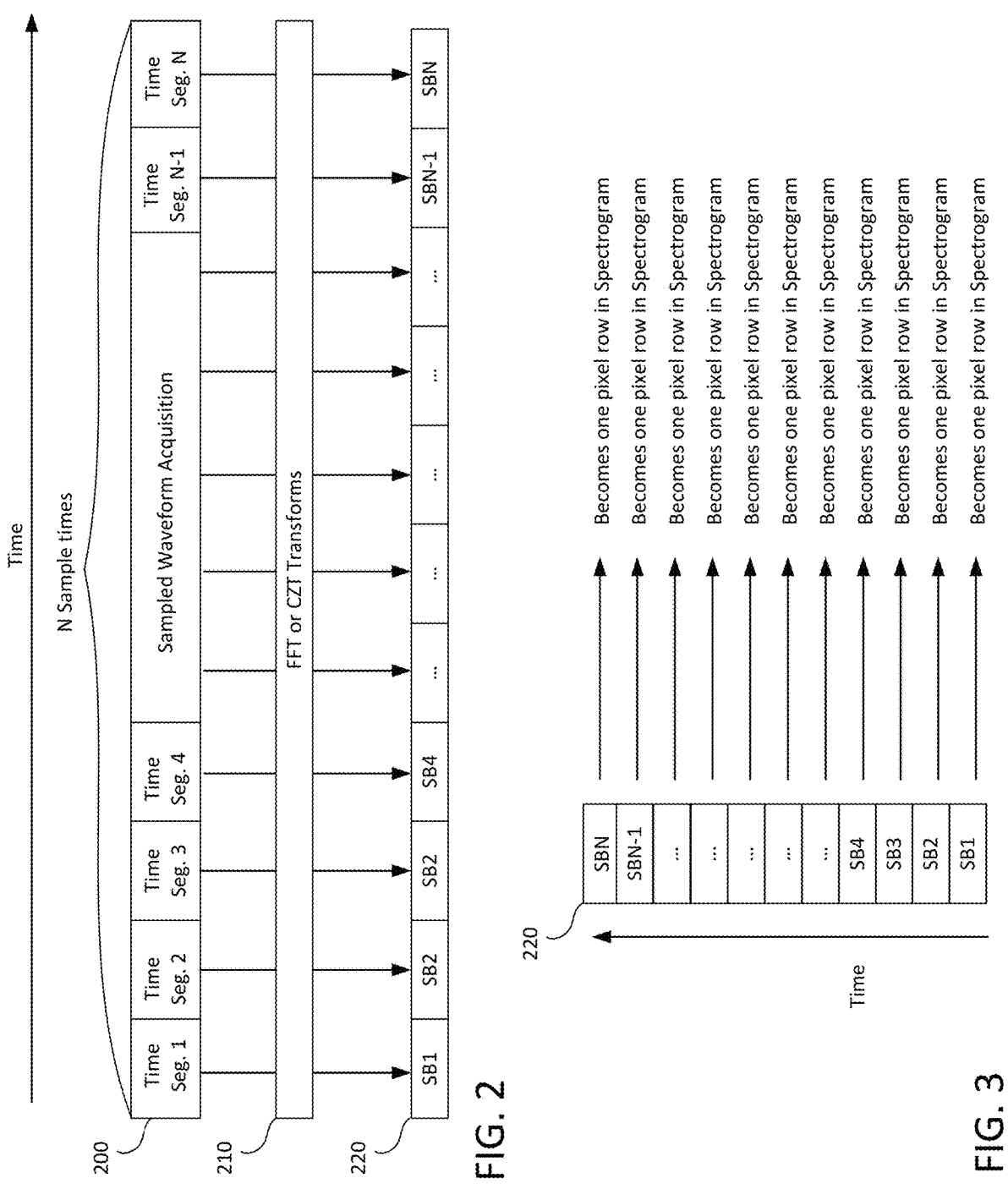
FIG. 2 is a block diagram illustrating how a sampled input waveform acquisition is processed into individual spectral traces according to embodiments of the disclosure.
FIG. 3 is a block diagram illustrating how multiple spectral trace blocks are assembled to become a spectrogram, according to embodiments of the disclosure.

FIG. 2 illustrates a first series of steps for generating the spectrogram image from an acquired input signal waveform, which was generated by a device being tested by the instrument, or Device Under Test (DUT). The total amount of the time of the input signal acquired by the instrument is referred to as the acquisition time, and in FIG. 2 is represented as the total of all the individual time segments 1-10 of the acquisition 200. Both continuous and discontinuous types of spectrograms are generated by performing a time-to-frequency transform 210, such as a Fast Fourier Transform (FFT) or Chirp-Z Transform (CZT) of a time-delimited portion of the input signal acquisition 200 to create a series of spectrum traces 220. The series of spectrum traces 220 is formed from N number of individual spectrum blocks SB1, SB2, . . . , SBN. As described above, discontinuous spectrograms have time gaps where not all portions of the input signal waveform have corresponding spectrum traces generated. Conversely, continuous spectrograms include spectrum traces for all portions of the input signal acquisition. The illustration in FIG. 2 represents a portion of constructing a spectrogram of the continuous type, since all portions of the acquisition 200 are represented by corresponding spectrum traces 220. Although variations are described below, in FIG. 2 it is assumed that the width of each spectrum block SB1, SB2, etc. is the same as the spectral width produced by the frequency transform 210, which may be controlled by a user setting a resolution bandwidth, as described below.

Figure 4:
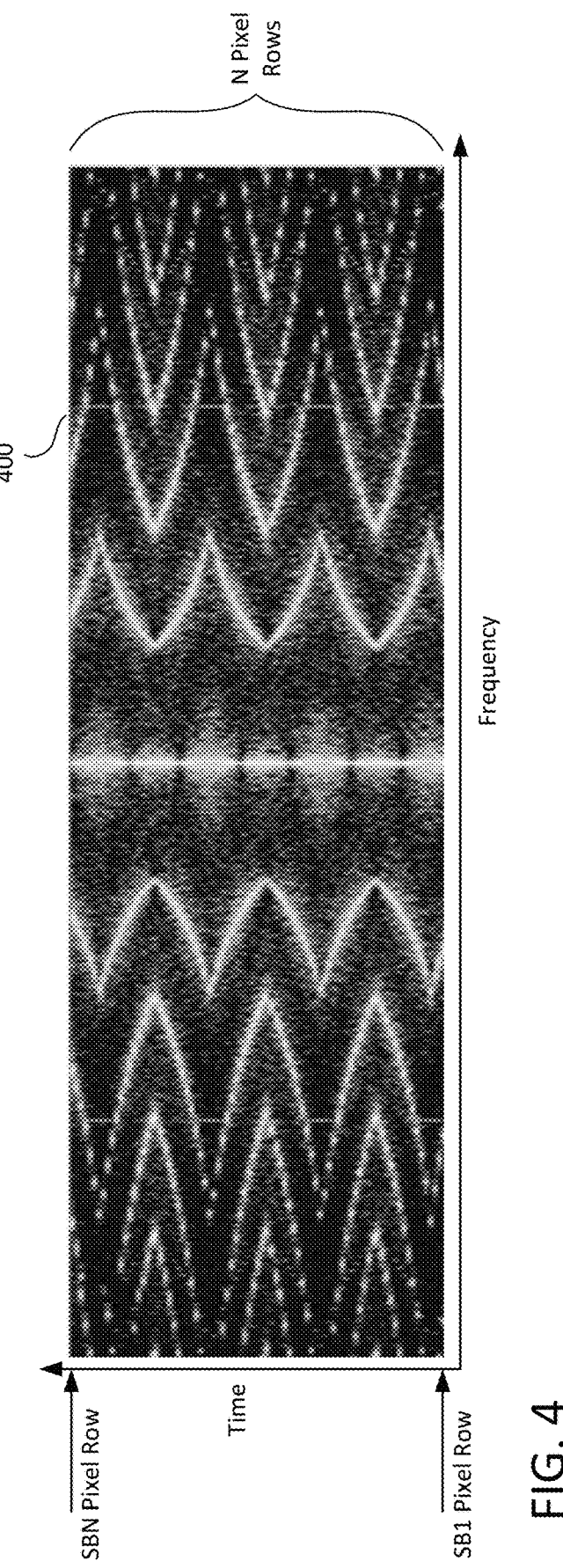
FIG. 4 illustrates an example spectrogram produced by the process outlined in FIG. 3, according to embodiments of the disclosure.

FIG. 3 illustrates how each spectral block SB1, SB2, etc. in the spectrum trace 220 is oriented to one another. Each spectral block SB1, SB2, etc. becomes one pixel row of the resultant spectrogram. And both FIGS. 3 and 4 illustrate how the spectral blocks are assembled to create the spectrogram, such as the spectrogram 400 of FIG. 4. Note that the oldest spectrum block, SB1, i.e., the first spectrum block generated, is placed at the bottom row of the spectrogram, as the spectrogram 400 of FIG. 4 is a waterfall spectrogram. Had the spectrogram 400 been a reverse-waterfall spectrogram, then the oldest spectrum block, SB1, would be placed at the top row of the spectrogram. As illustrated in FIG. 4, the spectrogram 400 includes N pixel rows, each of which correspond to a particular, individual, spectrum block SB1, SB2, etc. Also, as described above, the X-axis of the resultant spectrogram 400 measures frequency, while the Y-axis of the spectrogram measures time.

Figure 5:
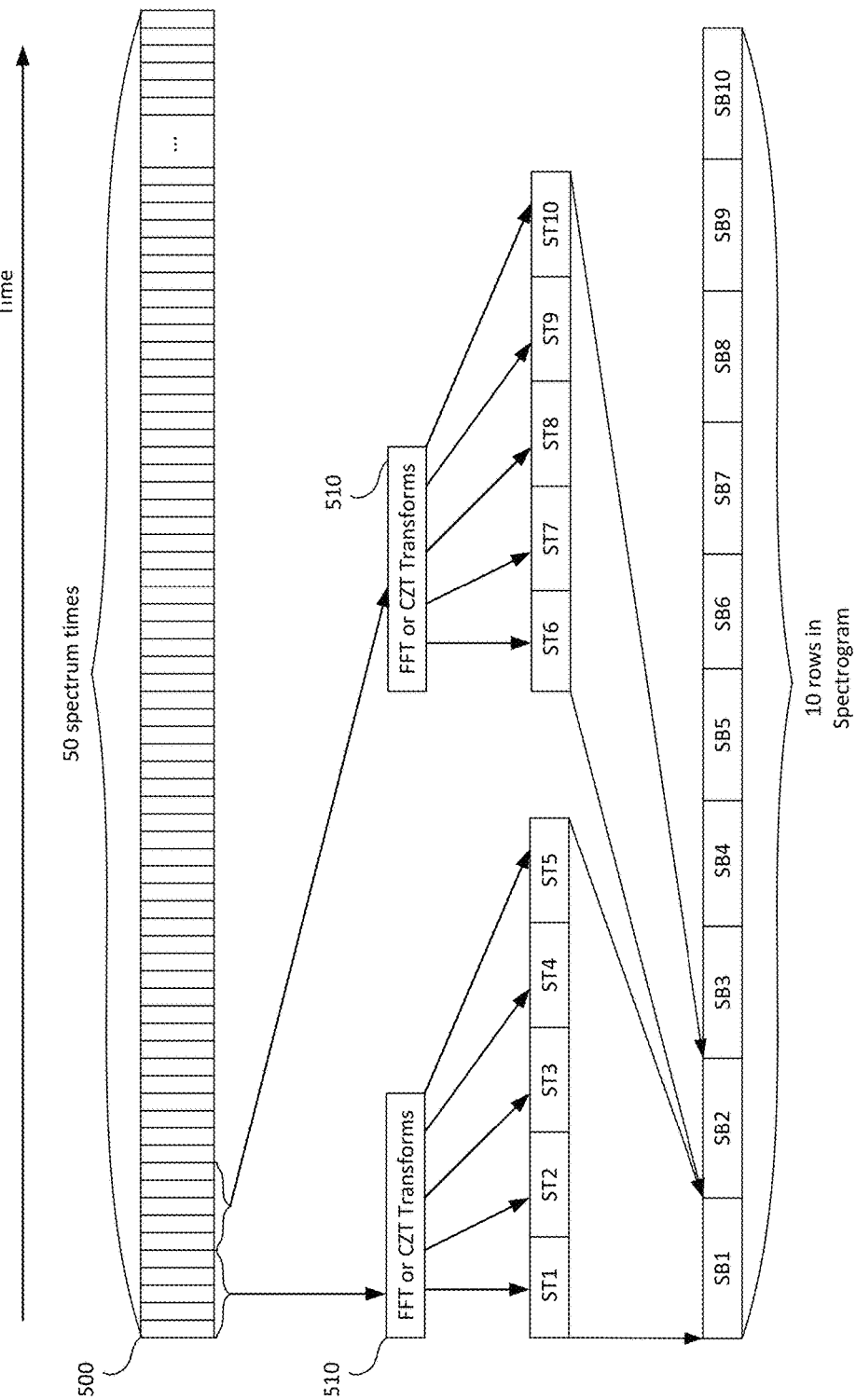
FIG. 5 illustrates an effect of selecting a spectrum time that is less than a block time, according to embodiments of the disclosure.

The individual spectrum blocks SB1, SB2 of FIG. 2 were assumed to have the same block width as width produced by the transform 210, which is not always true. Instead, the width produced by the transform 210 may be larger or smaller than the width of the individual spectrum blocks. For clarity, the duration of the time-domain data used by the transform 210 of FIG. 2 is referred to as the spectrum time, and corresponds to the width of each particular time portion, labeled Time Segment 1-Time Segment 10, of the original acquisition 200 processed in each single process by the transform 210. In the process described with reference to FIG. 2, the width of the spectrum time, generated by the transform 210, also equals the width of the individual spectrum blocks. FIG. 5 illustrates a different case, where the width of the spectrum time is less than the width of the individual spectrum blocks.

With reference to FIG. 5, the spectrum time is 2% of the total width of an input signal acquisition 500, rather than 10% as in FIG. 2. So, this means that there are 50 total spectrum times contained within the input signal acquisition 500. But, since there are still ten rows of pixels in the ultimate generated spectrogram, with each row produced by one of the ten spectrum blocks SB1-SB10, this means that there will be five spectrum times combined into a single spectrum block. In general, the spectrum-time produced by a transform 510 is inversely proportional to the frequency resolution, or Resolution Bandwidth (RBW) and the selected Window type of the individual spectrum traces produced by the transform 510. Narrower RBW settings lead to longer spectrum times, while wider RBW result in shorter spectrum times. In one example, a 100 kHz RBW has a spectrum time of 22.3 µS, while a 10 kHz RBW has a spectrum time of 223 µS. The spectrum time therefore describes the length, in time, of the original acquired input signal waveform used to generate the individual spectral traces used to create a single spectrum block. As illustrated in FIG. 5, five spectral traces, ST1, ST2, ST3, ST4, and ST5, produced by the transform 510 are combined to create the spectrum block SB1, which, as described above, becomes one row of pixels for the resultant spectrogram. Then the process advances to process the second spectrum block, SB2, where another five spectral traces, ST6, ST7, ST8, ST9, and ST10 produced by the transform 510 are combined to form the spectrum block SB2. Although not illustrated, this process continues with the remainder of the spectrum times in the acquired input signal acquisition 500 until all ten of the spectrum blocks SB1-SB10 are generated, and assembled, to become the spectrogram image. There are multiple techniques that may be used to combine multiple spectral traces, such as ST1-ST5, into a single spectrum block, such as SB1. One such combination technique is processing the spectral traces by using max hold detection, for instance, which is a known technique in spectrum processing. Also, it is not necessary that the spectrum time be an exact integer multiple of a spectrum block time, but rather embodiments of the invention address this by overlapping the final spectrum time of a block into a subsequent spectrum block. Examples of such techniques are described in more detail below.

The examples described with reference to FIGS. 2-5 all assume that the width of the spectrum blocks is the same or larger than the spectral time, but there may be cases where the width of the spectrum blocks is less than the spectrum time, especially when the number of rows in the produced spectrogram grows large. Creating the spectrogram image with such conditions introduces the concept of 'overlap', which is described below.

Figure 6:
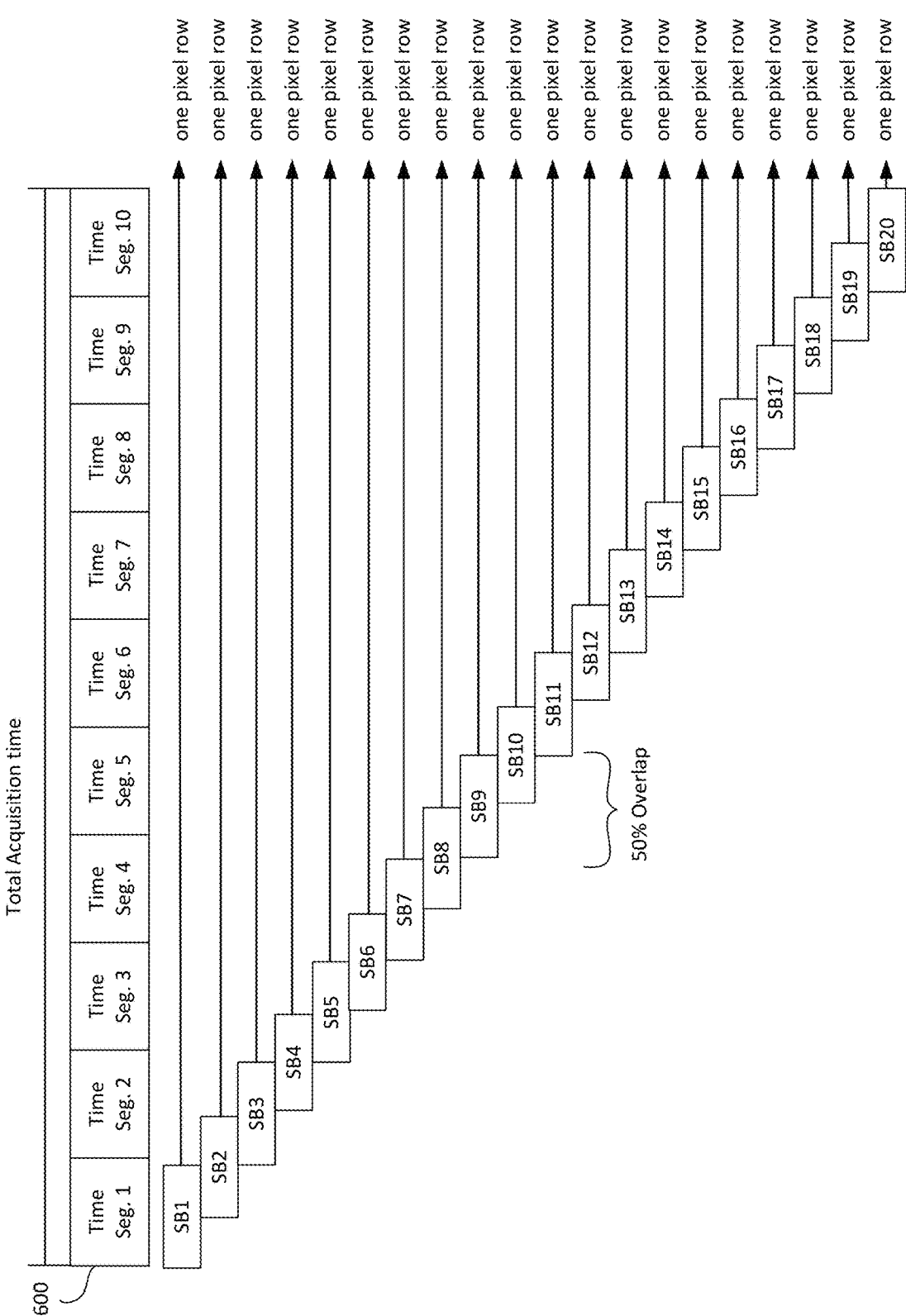
FIG. 6 illustrates an example of creating a spectrogram with overlap, according to embodiments of the disclosure.

FIG. 6 illustrates an example where the spectrum time of an input signal waveform acquisition 600 is 10% of the total acquisition time, and where there are 20 available rows to produce the spectrogram. Therefore, the acquisition 600 is divided by the number of available rows to set a spectrum slice interval. If the spectrum slice interval is less than the spectrum time, which in this case correlates to each of the time segments, Segment 1-Segment 10, then processing of each spectral blocks SB1-SB20 includes times from overlapping spectrum times. For instance, the spectrum block SB2 in FIG. 6 spans both Time Segment 1 and Time Segment 2 of the original acquisition 600. Ultimately, twenty spectrum blocks, SB1-SB20 are generated from the ten time segments in the acquisition 600, and the twenty spectrum blocks SB1-SB20 each make up a single pixel row of the ultimate spectrogram image. In the example of FIG. 6, there is 50% overlap of the spectrum blocks compared to the original spectrum times of the time segments. In practice, the overlap may vary widely, between just over 0% to nearly 100% overlap. A 0% overlap of spectrum blocks is a system where there is no overlap of spectrum times across adjacent spectrum blocks, such as the examples described with reference to FIGS. 2-5. It should be noted that, although perhaps unlikely, it is also possible that the user has selected time domain settings for the waveform view that require a far smaller slice of time than what is needed to generate the view for the spectrum view. When this occurs, the spectrogram will contain only a single row in the resultant image. Embodiments of the invention may note such a condition to the user by presenting an indication of the condition, such as a color warning, or a text message on the display screen altering the user to the condition. Determining how to create a spectrogram image with precisely enough overlap to maximize available space in the display provided for the spectrogram is extremely complex, but embodiments according to this disclosure provide tools to the user to control the size of the resultant spectrogram without requiring any knowledge of how spectrograms are created, and instead provide tools through a graphical user interface to allow the user to easily create and modify spectrograms to the specific desired use.

Figure 7:
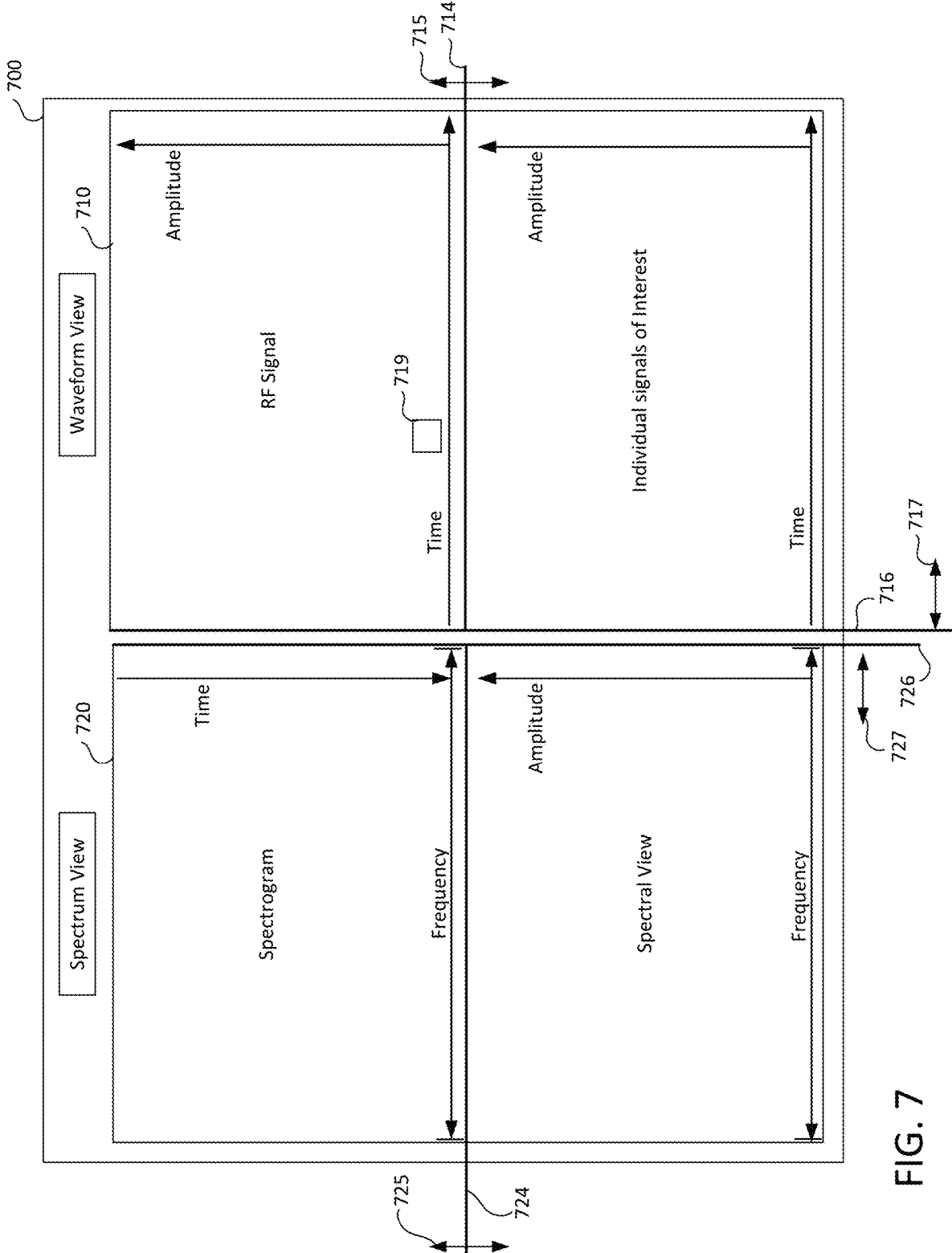
FIG. 7 is a block diagram of an example display for an instrument that includes a spectrum view of an input waveform sample in a first portion of a display screen, as well as a waveform view of the input waveform in a second portion of the display screen, according to embodiments of the disclosure.

FIG. 7 is a block diagram of an example display 700 for an instrument that includes a spectrum view 720 of an input waveform sample acquisition in a first portion of a display screen, as well as a waveform view 710 of the input waveform acquisition in a second portion of the display screen, according to embodiments of the disclosure. In general, the example display 700 is a display generated by the instrument based on an acquired input signal acquired from a DUT. One portion of the display 700, in this example the right hand portion, shows information and measurements made on the input signal acquisition in the time domain, and is generally referred to as a waveform view 710. Actual screen shots showing example waveform views are illustrated below. In general, the waveform view 710 includes a graphical representation of the amplitude of the input signal, or signals, in the acquisition over time. Thus, the X-axis of the waveform view 710 measures time, while the Y-axis of the waveform view measures amplitude of the signal. Amplitude may be any characteristic of the signals being measured by the user, such as voltage or current, for example. An upper window portion of the waveform view 710 may include an RF signal display, while a lower window portion of the waveform view 710 may include one or more specific, individual, signals, which may or may not be components of the composite RF signal from the acquired input signal waveform. Of course, other display configurations are possible, and in general the user controls which displays may be shown in the waveform view 710 by selecting appropriate user controls of the instrument, as is known in the art.

A spectrum view 720 is generally shown on the portion of the display 700 that is not occupied by the waveform view 710. An upper window portion of the spectrum view 720 may include a spectrogram of the acquired input signal waveform, which is generated as described in detail above. Also as described above, the spectrogram measures frequency on its X-axis and time on its Y-axis. As time is decreasing from top to bottom of the Y-axis, the spectrogram described in FIG. 7 is a waterfall spectrogram. Had the spectrogram been a reverse-waterfall spectrogram, the time would have instead been increasing in an upward manner along the Y-axis.

A bottom portion of the spectrum view 720 may include a window showing an individual spectral view of the desired signal of interest, which may be one of the signals also shown in the lower portion of the waveform view 710. With reference back to FIG. 1, the spectral view in the lower portion of the spectrum view 720 may be a single spectrum trace 102 of the acquired input signal. The width of the spectrum view 720 is controllable by the user setting start and stop frequencies to be displayed in the spectral view.

The example display 700 includes a user interface that allows multiple user controls. For example, there are controls to control the size of each of the respective windows in the waveform view 710. In one set of controls, a movable horizontal indicator 714 divides the waveform view 710 between the RF signal view window from the window showing signals of interest. The horizontal indicator 714 is controllable by the user, as indicated by reference 715, which indicates that the user may shift the relative position of the horizontal indicator 714 on the waveform view 710. Typically, the user would select the horizontal indicator 714 by an operation, such as clicking a mouse button while a cursor is positioned on or near the horizontal indicator. Once selected, the user can drag the horizontal indicator 714 up or down, in a vertical direction, to control the size of the individual windows making up the selected windows of the waveform view. Similarly, a vertical indicator 716 of the waveform view 710 controls the width of the windows making up the waveform view, and may be controlled by the user in a similar manner to controlling the horizontal indicator 714 described above. The ability to control the position of the vertical indicator 716 by the user is illustrated as reference 717, which allows the user to control the width of the windows making up the waveform view 710 by selecting and moving the position of the vertical indicator. In other embodiments, another set of controls in the user interface, not pictured in FIG. 7, provides a text or character window where the user may manually enter a horizontal and vertical size of each of the windows of the waveform view by entering values, such as pixel values, for either or both of the horizontal and vertical sizes. In other embodiments the user may enter an aspect ratio of either of the windows making up the waveform view 710.

The spectrum view 720 similarly includes a horizontal indicator 724 and vertical indicator 726, which may be respectively controlled by the user as represented by references 725, 727, in a similar manner as described for the waveform view 710. In some embodiments, the vertical indicators 716 and 726 need not be separate controls, and instead, only a single vertical indicator controls the relative horizontal sizes of the waveform view 710 and spectrum view 720. Additionally, or instead of manually moving the horizontal and vertical indicators 724, 726, in some embodiments the user may manually enter pixel sizes of the windows, or aspect ratios of the windows, also in a similar manner as described above.

As mentioned above, when the instrument generates the spectrogram in one of the windows of the spectrum view 720, it does so by creating individual rows of pixels in the spectrogram, where each row is generated from data within a spectrum block, which in turn is created from one or more spectral views, with each spectral view created by a time-to-frequency transform. The size of the transform is controlled by selecting a size of the frequency window used for the transform, which is directly related to the RBW, as described in detail above. The spectrum time may be shown in graphic form to the user, such as by generating and showing a spectrum time indicator 719, which appears in FIG. 7 in the RF signal window of the waveform view 710. Thus, the spectrum time indicator 719 is a visual indicator in the waveform view 710 that shows the user where (in time) the spectrum shown in the spectrum view 720 originates. Of course, other indicators are possible, or the spectrum time indicator may appear in the either or both of the windows of the waveform view 710. The spectrum time indicator 719 of FIG. 7 graphically shows a width of the spectrum time within the time domain window.

As mentioned above, the user may control the sizes of windows in the spectrum view, which has the effect of enlarging or shrinking the window in which the spectrogram is generated in the spectrum view 720. Embodiments of the invention automatically adjust the size of the spectrogram to fully fit within the window as the window size is modified by the user. Increasing the vertical size of the spectrogram provides better time resolution for the resultant spectrogram, as more rows of pixels are represented in the spectrogram. Conversely, decreasing the size of the spectrogram provides less resolution for the resultant spectrogram as fewer rows of pixels are represented in the spectrogram. Thus, there is a direct correlation between an amount of overlap, which is a measurement of how much data contained in a single element of spectrum time is presented in two adjacent spectrum blocks, and the time resolution of the resultant spectrogram. More overlap, as measured in overlap percentage, provides a higher time resolution, while less overlap provides less time resolution.

Embodiments of the invention automatically maximize the size of the spectrogram to fill the spectrogram window as the spectrogram window size is controlled by the user. For example, when the user increases the vertical size of the window containing the spectrogram window, the instrument automatically generates a new spectrogram by increasing the number of lines of pixels in the spectrogram to match the vertical size of the window specified by the user. For example, with reference to FIG. 6, the spectrogram was produced with twenty pixel rows over ten spectrum times, for an overlap value of 50%. If the user would increase the size of the window containing the spectrogram, for example to a window that could contain a spectrogram with 30 pixel rows, embodiments of the invention automatically generate a new spectrogram having 30 pixel rows in response to the increased window size. In such a case, the instrument, or more specifically a processor within the instrument, first determines how many pixel rows will fit in the increased window size. In this example, the processor determines that the spectrogram will be maximized within the window with a spectrogram containing 30 pixel rows, and determines that 30 spectrum blocks are needed to perform the maximization, since each pixel row is created from one spectrum block. Next, the processor determines how much each of the individual spectrum blocks overlaps its adjacent spectrum blocks due to the increased number of spectrum blocks in the spectrogram. For instance, with 30 pixel blocks, SB1-SB30, each adjacent block will overlap its adjacent blocks 66%, which is more than the 50% overlap that was used to produce the spectrogram of FIG. 6. The processor makes the determination by evenly distributing the width of the total number of spectrum blocks over the number of spectrum times in the acquired input signal sample, and then determining how much a particular block overlaps its adjacent block. In this example, each spectrum block used to create the spectrogram overlaps its adjacent blocks by 66%. After making such a determination, the processor generates the individual spectrum blocks by combining the spectrums from the individual transforms for each spectrum time, as described above. Finally, the processor assembles the new individual spectrum blocks into a new spectrogram, by concatenating the spectrums created by each of the individual spectrum blocks with one another, with each spectral block becoming a single row of the new spectrogram. Then, the processor displays the new spectrogram to match the size of the window specified by the user. When a user shrinks the size of the spectrogram window, the processor performs the same operation, first by determining how many pixel rows will fully fill the smaller window, and then downwardly adjusting the overlap between the number of spectrum blocks used to create each pixel row.

The process described above allows the user to control the instrument to automatically modify a resolution of a resultant spectrogram, merely by specifying the size of the window in which the spectrogram is displayed.

In some embodiments, the amount of overlap of adjacent spectrum blocks is generated in percentage form, and displayed to the user in the spectrogram window, or elsewhere on the display of the instrument. This provides the user with a real-time view of the amount of overlap used to generate the spectrogram being shown on the display.

Figure 8:
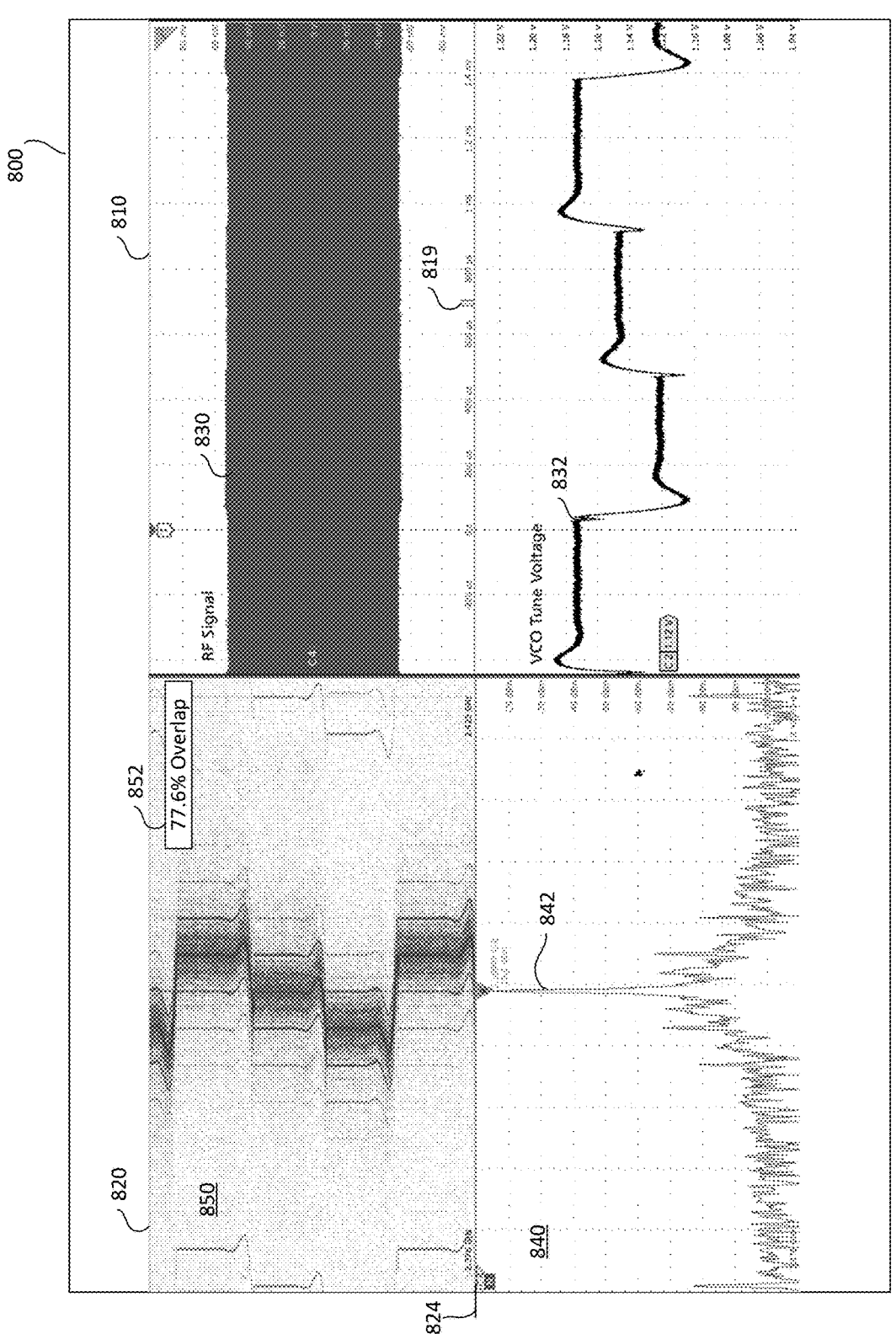
FIG. 8 is a screen shot illustrating an example display screen that includes a spectrogram display, a spectral display, and two different waveform displays of an instrument that includes automatic determination of spectrum and spectrogram attributes, according to embodiments of the disclosure.
Figure 9:
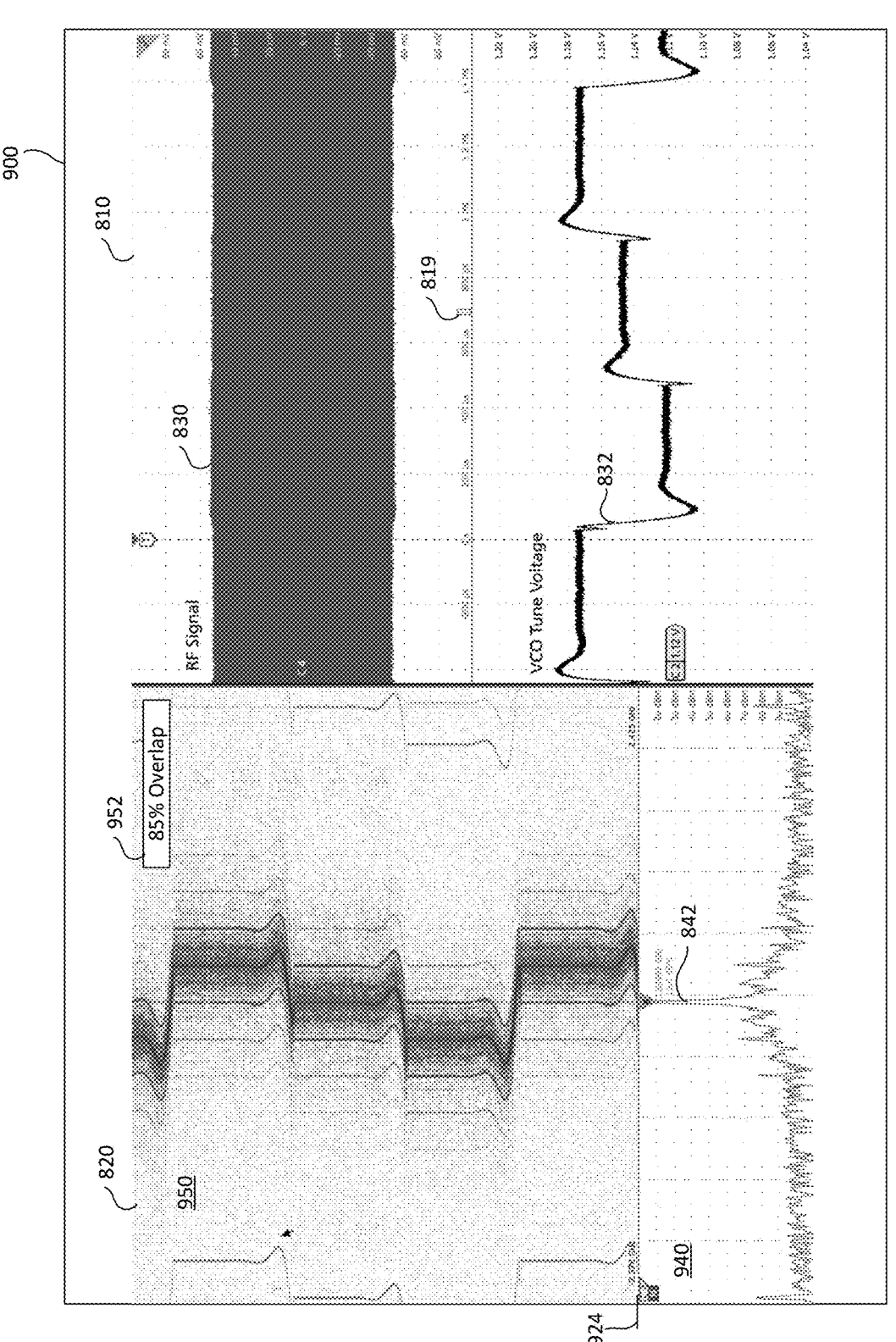
FIG. 9 is a screen shot illustrating changes to the display of FIG. 8 when a user operates a user interface of the instrument that generated the spectrogram of FIG. 8, according to embodiments of the invention.
Figure 10:
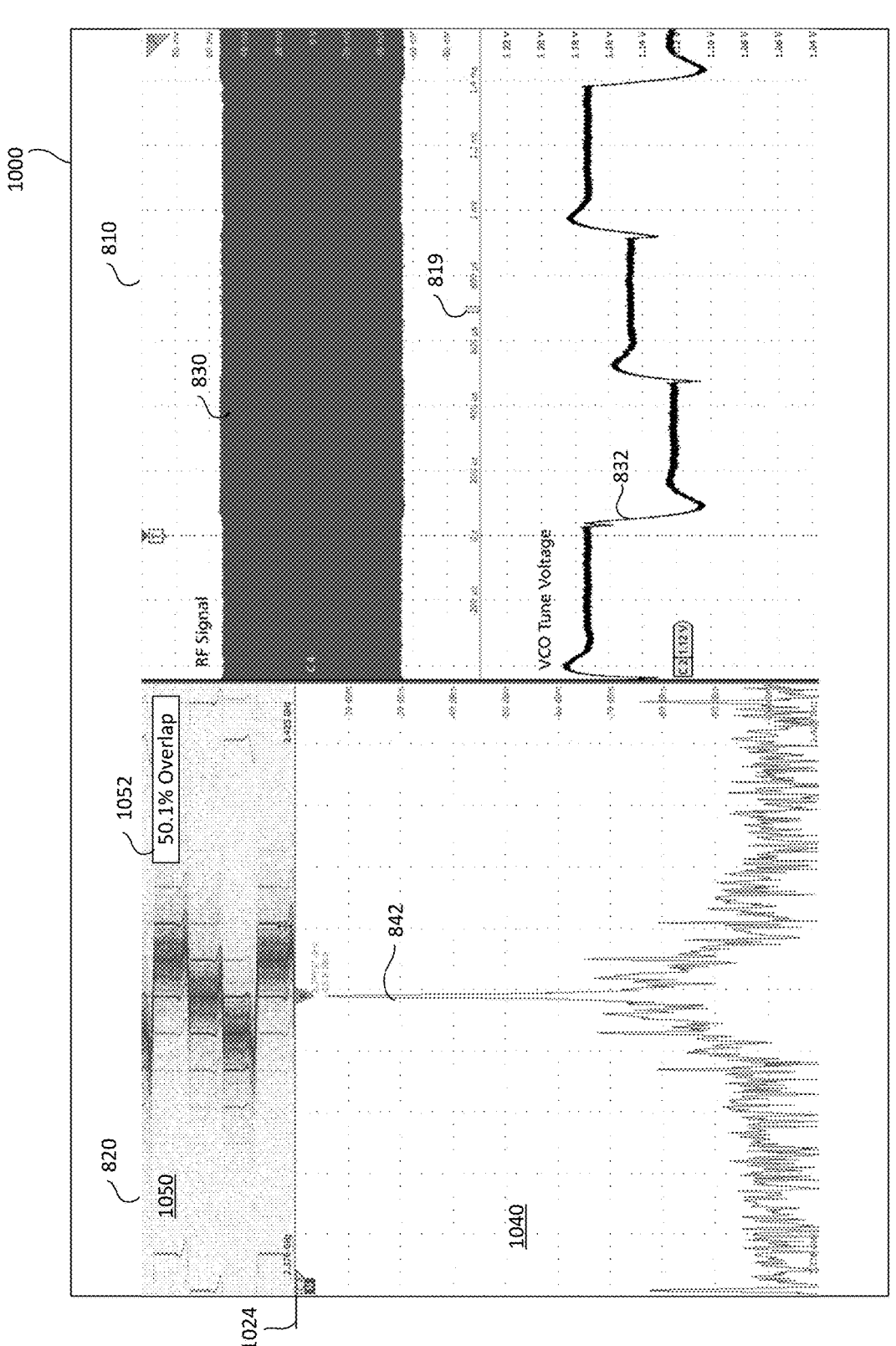
FIG. 10 is a screen shot illustrating different changes to the display of FIG. 8 when a user adjusts a user interface of the instrument that generated the spectrogram of FIG. 8, according to embodiments of the invention.

FIGS. 8, 9, and 10 illustrate example displays generated by an instrument that are modified in response to a user controlling the size of a window containing a spectrogram image. A display 800 in FIG. 8 includes a waveform view 810 as well as a spectrum view 820, which may be examples of the views 710, 720 described with reference to FIG. 7. An RF signal 830 appears in an upper window of the waveform view 810, which is a representation of an acquired input waveform generated by an instrument from a signal supplied by a DUT. Specifically, the RF signal 830 is a signal acquired on a particular input channel of the instrument, in this case channel 4. An individual signal trace of the input signal 832 shows an amplitude, which in this example is measured in volts, over time, of another signal acquired on another input channel of the instrument, in this case channel 2. In this example, the signal on channel 2 is a Voltage Control Oscillator tuning voltage signal.

The spectrum view 820 includes a spectrum trace 842 in a window 840. This spectrum trace 842 is the frequency view that corresponds to the input signal selected in the waveform view 810. In this example the selected input signal is the signal 832, i.e., the signal acquired on channel 2. The spectrum trace 842 illustrates the frequency response of the input signal 832 for the specific spectrum time 819 duration of the input signal 832. The particular spectrum time of the input signal 832 to generate the spectrum trace 842 is shown in FIG. 8 as reference 819.

A spectrogram 850 is shown in an upper window of the spectrum view 820. The spectrogram 850 is generated as described above, based on the acquired input signal waveform. Note that the spectrogram 850 fully fills the upper window of the spectrum view 820, and that a horizontal indicator 824 shows the delineation between the upper and lower windows of the spectrum view 820. The horizontal indicator 824 may default to a middle vertical position of the spectrum view 820 when the spectrum view 820 is initially selected by the user to appear on the display 800. In this example of FIG. 8, the generated spectrogram 850 is automatically sized to the default size of the upper window of the spectrum view 820. Also in this example, the amount overlap between adjacent spectrum blocks used to create the generated spectrogram 850 has 77.6% overlap, and an indication of the amount of overlap is shown to the user in an overlap display 852. In some embodiments the user may initially specify a particular amount of overlap for the spectrogram in an initial view, and the instrument automatically sizes the initial window containing the spectrogram to match the specified amount of overlap. In other embodiments, the amount of overlap is determined by one or more processors of the instrument, as described above, to maximize the default window size in the spectrum view 820.

Recall from above that the relative sizes of the windows of the spectrum view 820 may be controlled by a user. FIG. 9 shows the effect of a user modifying a window size of the window containing the spectrogram 850 of FIG. 8. The user may modify the window size by dragging the horizontal indicator 824, or by specifying a particular size for the window using a numerical interface of a user interface (not illustrated). FIG. 9 shows a new display 900 that is generated by the instrument when a user increases the window size of the upper window in the spectrum view 820, such as by moving the horizontal indicator 824 of FIG. 8 to its new position. The new horizontal indicator is referred to as reference 924. Note that the new position of the horizontal indicator 924 has increased the window size of the upper window of the spectrum view 820. In response to the increased window size, embodiments of the invention automatically create a new spectrogram 950 sized to fill the new window. Recall from above that more vertical size available for a spectrogram causes the instrument to create a new spectrogram having more pixel rows compared to its previous size, which also increases its resolution. Also, because of the increased number of pixel rows, there is more overlap between adjacent spectrum blocks used to create each pixel row. Embodiments of the invention, using the process described above, determined that a spectrogram having 85% overlap will fully fill the newly sized window, generates the new spectrogram having 85% overlap, and displays it in the upper window of the spectrum view 820, based on the user increasing the size of the spectrogram window. The instrument also updates the indication of overlap to 85%, and displays the indication in an overlap display 952, so that the user may a numerical representation of the new amount of overlap.

Increasing the size of the upper window of the spectrum view 820 also simultaneously decreases the size of the lower window 840 to a newly sized window 940. Decreasing the vertical size of the lower window causes the instrument to adjust the vertical scale of the spectrum trace in the lower window of the spectrum view 820 to fully fill the new size of the lower window.

FIG. 10 shows the effect of decreasing the vertical size of the upper window of the spectrum view 820 from its original size illustrated in FIG. 8. These effects are similar to those described with reference to the new display of FIG. 9, except they work in reverse. In FIG. 10, a display 1000 illustrates a new display generated by an instrument when the user decreased the size of the upper window in the spectrum view 820 from its size shown in FIG. 8. A horizontal indicator 1024 delineates the upper and lower windows of the spectrum view 820. In response to the user decreasing the window size, the instrument automatically generates a new spectrogram 1050 that has fewer rows of pixels than the spectrogram 850 of FIG. 8. In particular, one or more processors of the instrument determines the number of pixel rows needed for the new spectrogram 1050 based on the new size of the upper window of the spectrum view 820. Then the one or more processors adjust the amount of overlap between adjacent spectrum blocks used to create the pixel rows of the new spectrogram 1050 so that the new spectrogram fully fills the newly sized window. In this case, the one or more processors determined that a spectrogram having 50.1% overlap fully fills the newly sized window. Then the instrument creates the new spectrogram 1050, displays it in the upper window of the spectrum view 820 of the display 1000, and updates an overlap display 1052 to the new overlap number. Simultaneously, the vertical size of the lower window of the spectrum view 820 is increased, due to its larger size, and a new spectrum trace 1040 is shown in the new window.

Embodiments of the invention thus provide a user interface that allows a user to control a size and resolution of a spectrogram by manipulating only a size of a window, larger or smaller, in which the spectrogram is displayed. And then a new spectrogram is automatically generated to fully fill the newly sized window. Although such embodiments have broad appeal, they may not be desirable in all applications. For this reason, according to other embodiments of the disclosure, the time resolution of the spectrogram may not necessarily be tied to the size of the spectrogram display window, and may not automatically change in response to a user changing the size of the display window. Instead, in these other embodiments, timing resolution of a generated spectrogram may remain fixed as a user changes the size of the spectrogram display, and one or more processors of the instrument, for example a Graphics Processing Unit (GPU), may upsample or downsample the graphical image of the spectrogram. In these embodiments, there may be a user interface control, e.g., a dial or scroller labeled "resolution," that a user can adjust to change the timing resolution of the calculated and displayed spectrogram. Some embodiments may also include a user interface control for a user to adjust other attributes of the spectrogram, such as the aspect ratio. One advantage of these embodiments may be for documentation. For example, embodiments may include a contextual menu, or other input, that lets a user copy a snapshot of the spectrogram image into the clipboard or save it to a file. Users can size the spectrogram display window however they wish for ease of live-viewing on the display, depending on monitor size and resolution, but the resolution of the saved/exported snapshot remains constant for the sake of consistent documentation, for example a report document with multiple snapshots in it.

In the examples described above, the spectrograms are generated based on an entire, or at least a very large portion, of an acquisition of the input signal made by an instrument from a signal generated by a DUT. Other embodiments according to this disclosure provide a user interface through which a user may specify particular portions of a signal acquisition, where only the specified portions of the signal acquisition are used to create a spectrogram. In other words, in these embodiments, the user may specify that the instrument create a spectrogram from only a particular portion of the acquired signal. This allows the user to focus on particular portions of the acquisition sample that are of interest to the user, by controlling the instrument to generate a spectrogram from only those portions of interest.

Figure 11:
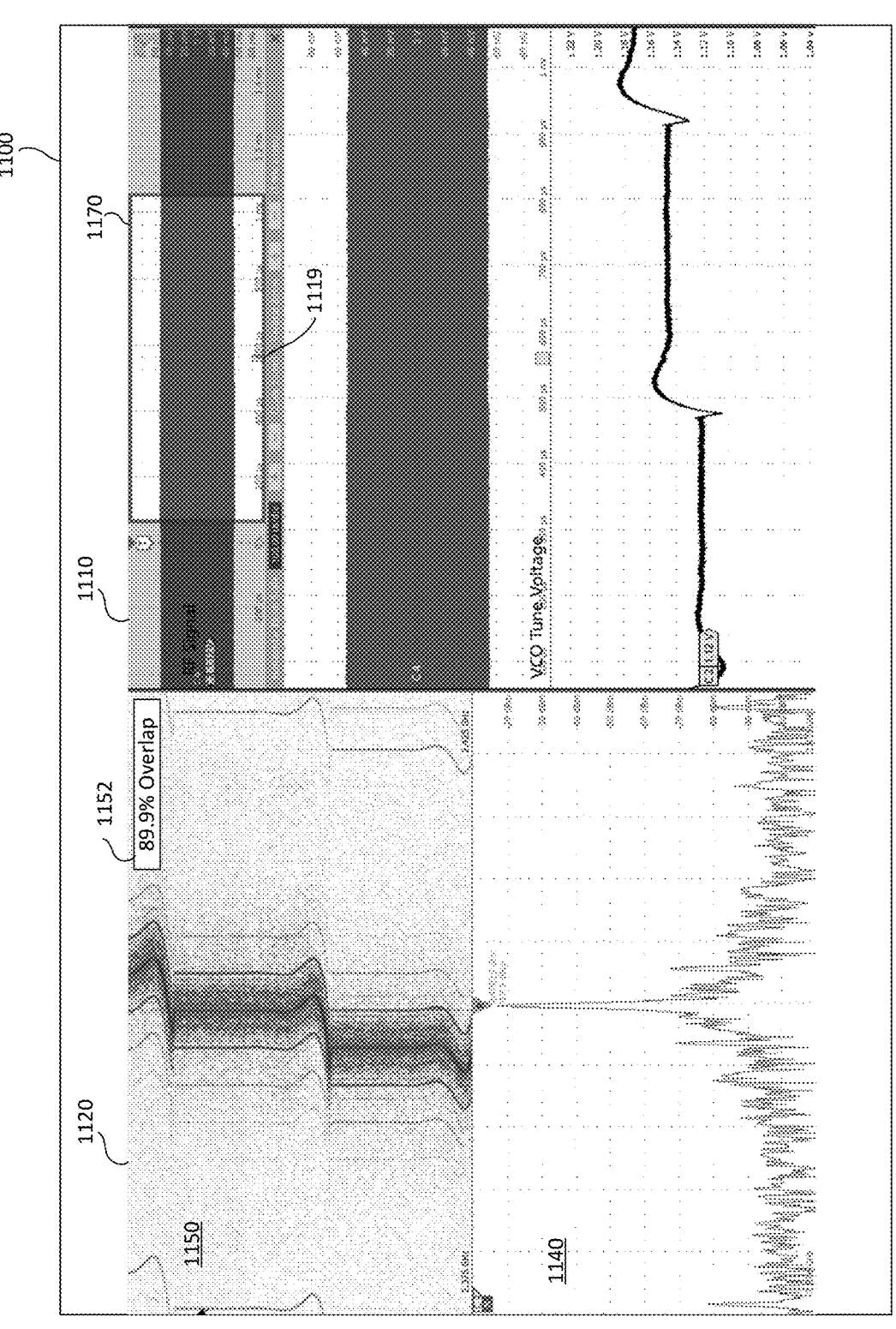
FIG. 11 is a screen shot illustrating an example display screen that includes a spectrogram display, a spectral display, and a zoom window in a waveform display of an instrument that includes automatic determination of spectrum and spectrogram attributes, according to embodiments of the disclosure.

FIG. 11 is a screen shot illustrating an example display screen 1100 that includes a spectrogram 1150, a spectral display 1140, and a zoom window 1170 in a waveform display 1110 of an instrument that includes automatic determination of spectrum and spectrogram attributes, according to embodiments of the disclosure.

The zoom window 1170 provides a graphical interface through which a user may specify a portion of an acquired input signal waveform for processing. This is compared to embodiments described above with reference to FIGS. 2-10 in which the instrument operates on an entire amount an input signal that has been acquired by the instrument. The size of the zoom window 1170 may be dynamically changed by the user through a graphical interface by selecting one or both horizontal edges of the zoom window, for example by using a mouse control button, and dragging the selected edge to a new position. In other embodiments, the user may change the size of the zoom window by entering its desired size through a numerical or textual interface.

Once the size of the zoom window 1170 has been established, a new spectrogram 1150 is generated based on only those portions of the acquired input signal waveform that are selected within the zoom window, and an updated overlap displayed in the overlap display 1152. Portions of the acquired input signal waveform that are not present within the zoom window 1170 are ignored by the one or more processors that generate the spectrogram, even though such portions are still retained within memory of the instrument.

The zoom window 1170 may be selectively enabled by the user, through a user menu or by other means. When selected, or enabled, the extent of the acquired input signal used to generate the spectrogram 1150 changes from the entire acquisition to the portion contained only in the zoomed view. When the zoom window 1170 is selected, embodiments of the invention generate and display the spectrogram, such as spectrogram 1150, using the same techniques as described above, albeit over the shorter time period defined by the zoom window 1170, rather than over the entire time period captured in the acquired input signal waveform. This means that, when the zoom window 1170 in waveform view is enabled, such as illustrated in FIG. 11, embodiments of the invention automatically generate a spectrogram 1150 that covers only those areas of the acquired input signal within the zoom window. Such an action also improves the timing resolution of the spectrogram because, by definition, including only a limited portion of the acquired input signal in the spectrogram increases the amount of overlap between adjacent spectrum blocks, as there is a shorter amount of acquired input signal used to generate the spectrogram. For example, with reference to FIG. 6 assume that the zoom window 1170 encompasses only Spectrum Times 1-4. This means that, instead of being spread over ten Spectrum Times 1-10, as in the original example, the 20 spectrum blocks SB1-SB20 are spread only over four Spectrum Times 1-4 in the zoomed example, substantially increasing the amount of overlap between adjacent spectrum blocks. As described above, increasing the amount of overlap between adjacent spectrum blocks increases the resolution of the resultant spectrogram.

Figure 12:
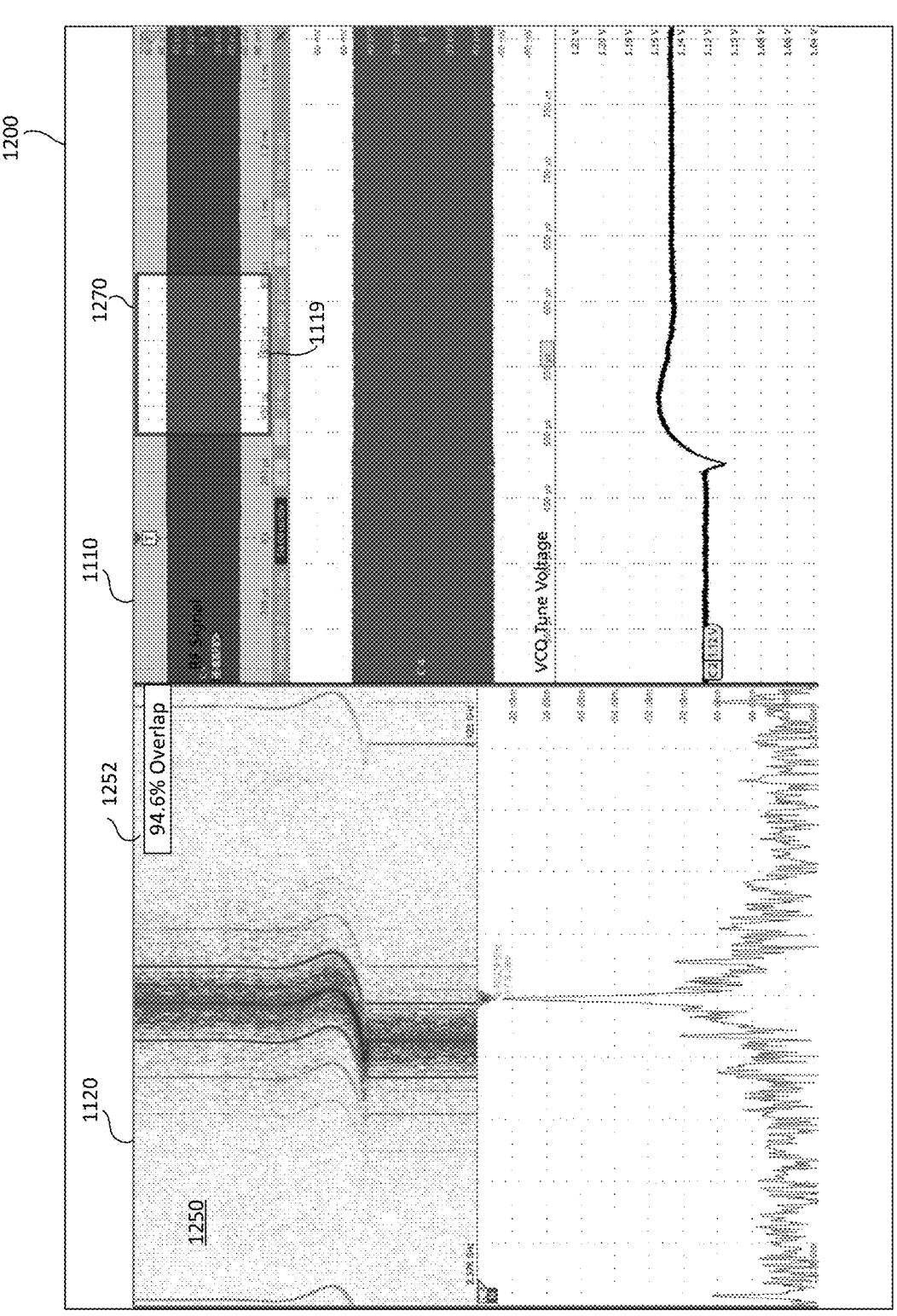
FIG. 12 is a screen shot illustrating changes to the display of FIG. 11 when a user modifies the zoom window illustrated in FIG. 11, according to embodiments of the disclosure.
Figure 13:
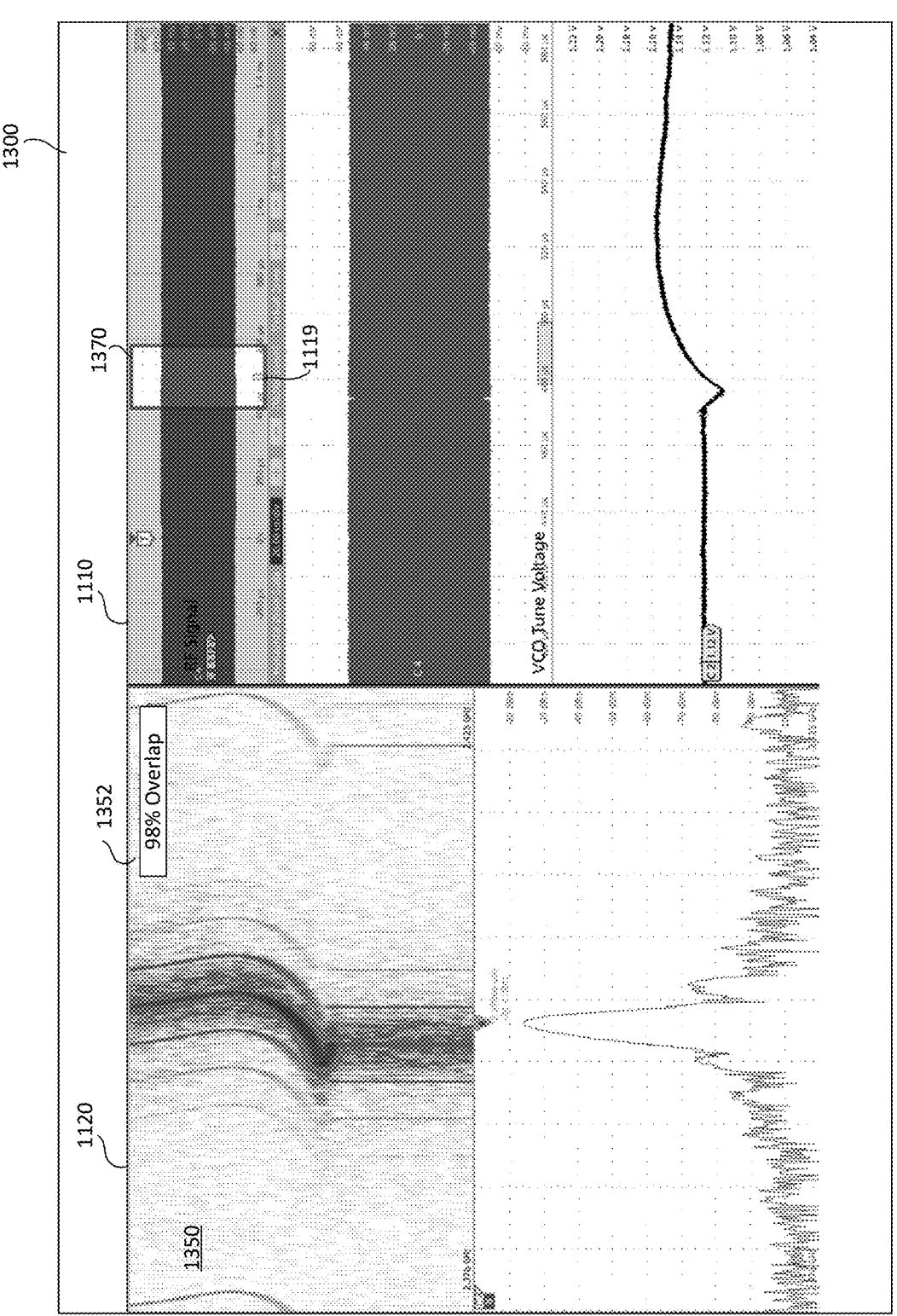
FIG. 13 is a screen shot illustrating different changes in the display of FIG. 11 when a user modifies the zoom window illustrated in FIG. 11, according to embodiments of the disclosure.

FIGS. 12 and 13 illustrate the effects of modifying the size of the zoom window 1170, and its resultant effects of the spectrogram that automatically adjusts to the amount of the acquired signal specified by the zoom window. A zoom window 1270 of a display 1200 of FIG. 12 selects a shorter amount of the acquired input signal compared to the zoom window 1170 of FIG. 11. In response, as described above, embodiments according to the disclosure create a new spectrogram 1250 that is limited to only that amount of acquired input signal selected by the zoom window 1270. Since the number of rows used to create the spectrograms 1150 and 1250 are the same, the overlap between adjacent spectrum blocks used to create spectrograms 1150 and 1250 increases from 89.9% overlap to 94.6% overlap, which increases the resolution of the spectrogram of FIG. 12 compared to FIG. 11. The new overlap percentage is shown in the overlap display 1252. Note that correspondence between the waveform view 1110, which shows the time domain, and the spectrum view 1120, which shows the frequency domain, is maintained. In other words, as the user zooms into an event of interest in the time domain using the zoom window 1270, the frequency domain view is also zoomed into the same period, and with increased timing resolution. As the user continues to make changes to the zoom window 1270, the spectrogram is also continuously updated to maintain correspondence between the two domains. Accordingly, some embodiments of the disclosure provide an ability for a user to intuitively obtain and maintain, as the user adjusts the zoom parameters of a zoom window, time correlated views across the time and frequency domains, as well as an ability to automatically align timing resolution in the spectrogram to the adjusted zoom parameters.

FIG. 13 illustrates an example where the user has zoomed in further to select even a shorter portion of the acquired input signal waveform though a zoom window 1370. In response, embodiments of the invention limit the generation of a spectrogram 1350 in a display 1300 to an even less amount of spectrum time than was used to generate the spectrogram 1250 of FIG. 12. Accordingly, the amount of overlap with the newly generated spectrogram 1350, based only on the amount of acquired input signal waveform specified by the zoom window 1370, increases from 94.6% overlap to 98% overlap, which is shown to the user in an overlap window 1352.

Of note is that changing the horizontal parameters of the zoom windows 1170, 1270, 1370, does not affect the width of the spectrum time, illustrated as 1119 in the time domain.

Also, the middle of spectrum time 1119 is anchored in the middle of the zoom windows 1170, 1270, 1370, no matter the sizes of the zoom windows.

Automatically creating a new spectrogram as a zoom window is modified may be computationally intensive. Computational resources may be conserved by waiting to generate a new spectrogram based on a zoom window being resized by a user until the resizing action has been completed. Other resources may be conserved by temporarily limiting the resolution of the resultant spectrogram until resources become available.

Further enhancements to a display that simultaneously shows a waveform view in the time domain and one or more views in the frequency domain may be made, either as a standalone enhancement to existing displays, or in conjunction with the displays as described in the above embodiments.

Once such enhancement allows a user an ability to select particular portions of a waveform in the time domain and simultaneously generate spectrum views of the selected portions in the frequency domain.

Figure 14:
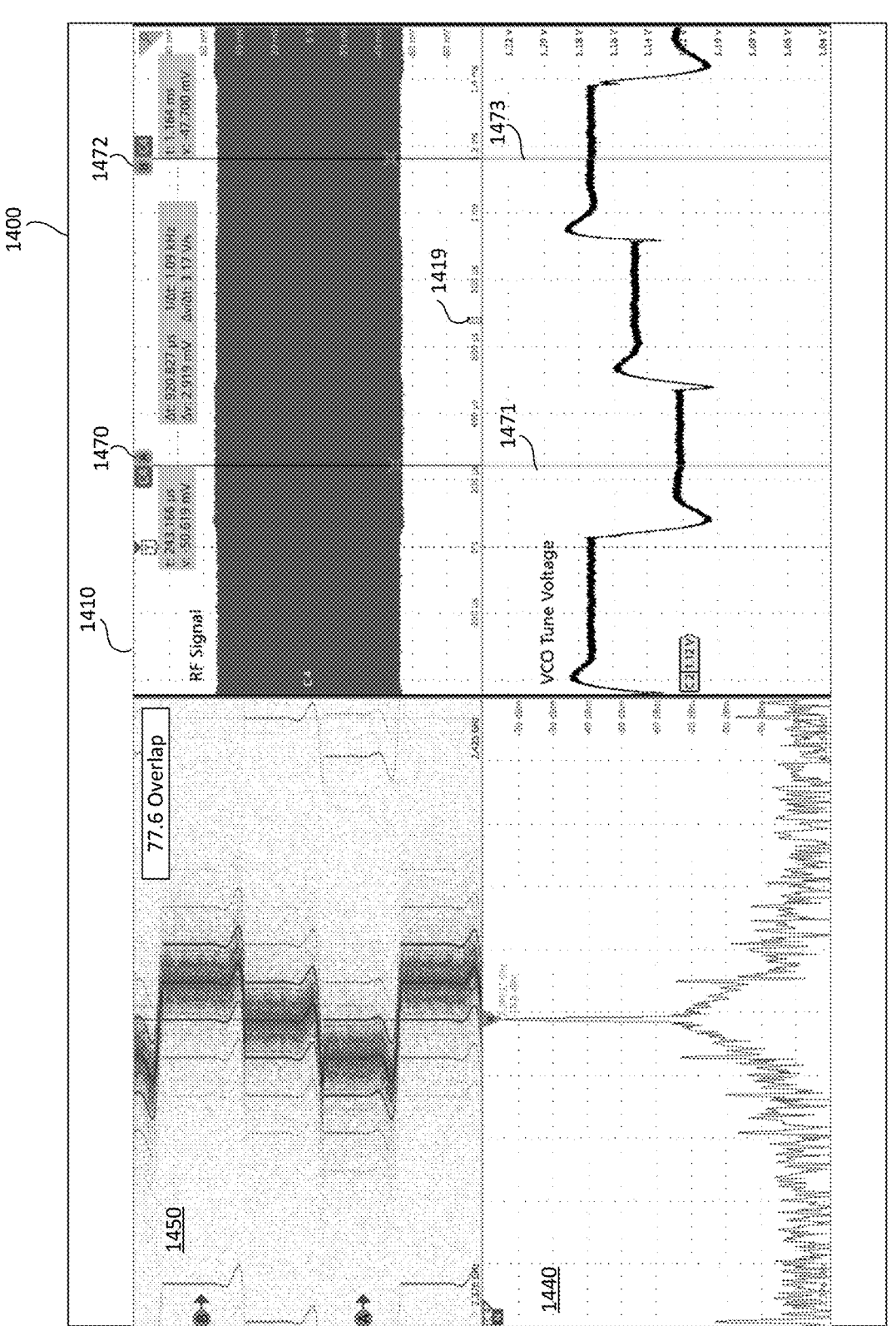
FIG. 14 is a screen shot illustrating an example display screen that includes a spectrogram display, a spectral display, and a waveform display that includes user controllable cursors, according to embodiments of the disclosure.

FIG. 14 is a screen shot illustrating an example display screen 1400 that includes a spectrogram 1450, a spectral display 1440, and a waveform display 1410. These displays operate the same or similar to the display screens described above, where an acquired input signal waveform is captured by a test and measurement instrument, and selected elements or portions of the acquired waveform are simultaneously displayed in the time domain and the frequency domain. Added to the display of FIG. 14, however, over and above the displays described above, are user controllable waveform cursors, according to embodiments of the disclosure. Waveform cursors 1470 and 1472 are labeled as A and B on FIG. 14, and appear on the waveform display 1410. The waveform cursors 1470, 1472 may be selectively enabled by a user through a user menu. Although only two waveform cursors 1470, 1472 are illustrated in FIGS. 14-16, any number of cursors may be enabled in various embodiments according to the disclosure.

The waveform cursors 1470, 1472 further respectively include cursor extensions 1471, 1473, into or through the waveform display 1410, to enhance viewing the location of the waveform cursors on the waveform display. Once enabled, waveform cursors 1470, 1472 may be positioned by the user by selecting and dragging either the cursor, or cursor extension. In other embodiments the waveform cursors 1470, 1472 may be generated by entering their position through a text menu.

Figure 15:
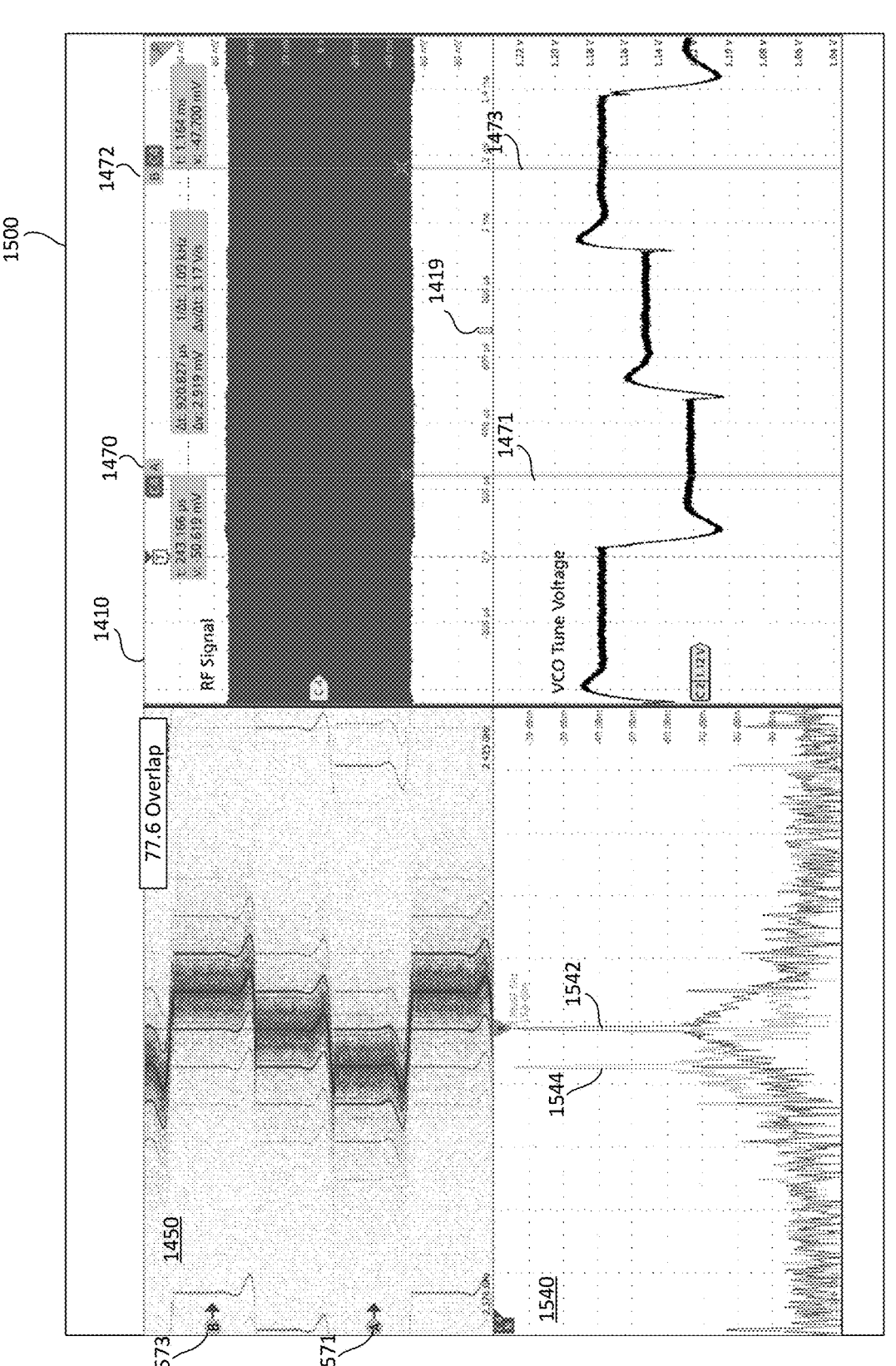
FIG. 15 is a screen shot illustrating an effect of creating a spectral display of a selected cursor illustrated in FIG. 14, according to embodiments of the disclosure.
Figure 16:
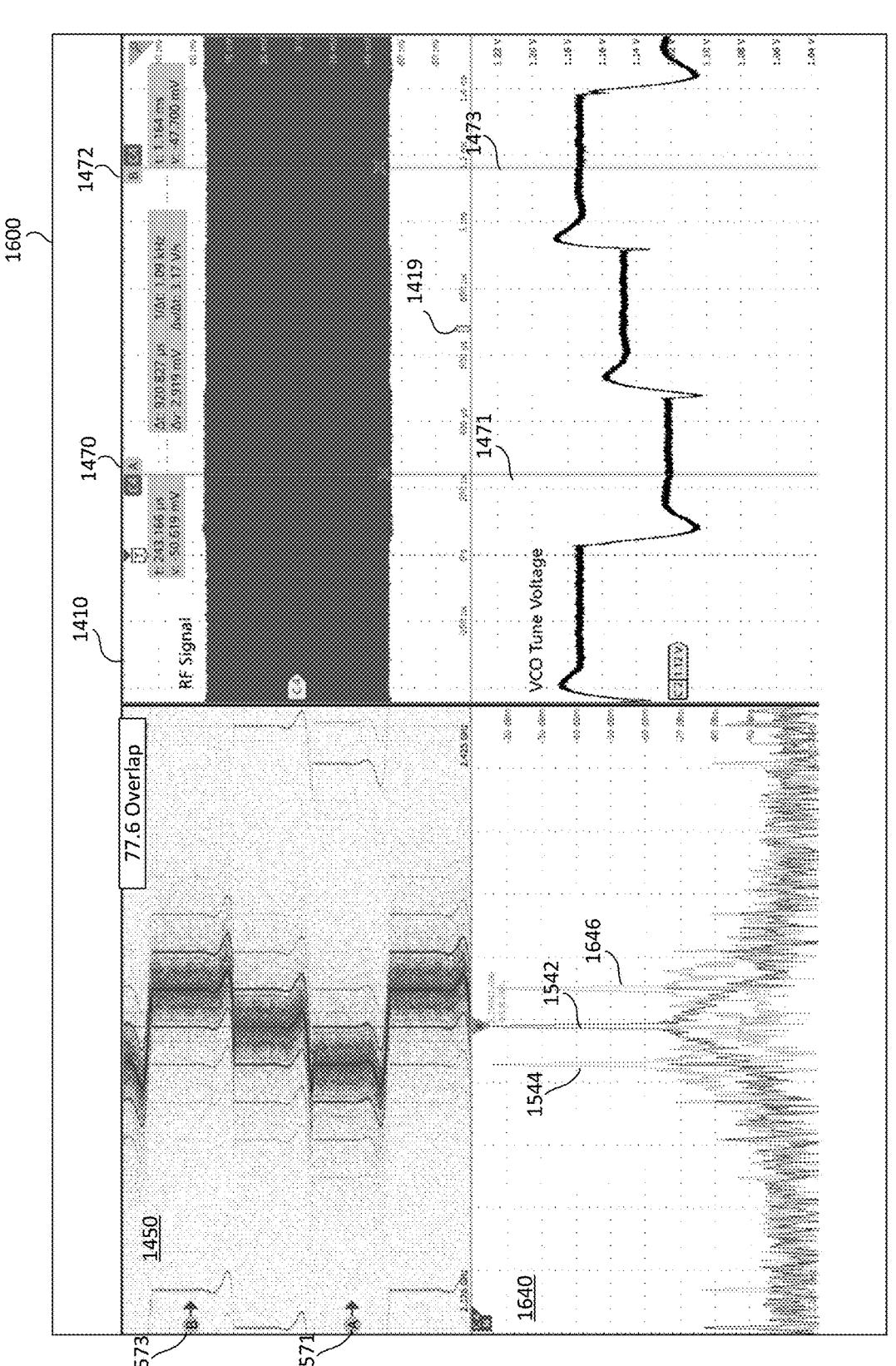
FIG. 16 is a screen shot illustrating an effect of creating a spectral display of a multiple selected cursors illustrated in FIG. 14, according to embodiments of the disclosure.

FIG. 15 is an example display 1500 that illustrates an effect of creating a spectral display of a selected cursor illustrated in FIG. 14, according to embodiments of the disclosure. With reference to the spectral display 1540, two individual spectrum traces, 1542 and 1544 are generated by the instrument and presented to the user. The spectrum trace 1542 corresponds to the spectrum trace generated from the portion of the selected input signal to the instrument for the spectrum time 1419, which is the same or similar to the spectrum traces as described in the above embodiments. Additionally in this display 1500, however, is a spectrum trace 1544 that corresponds to the portion of the selected input signal cursor surrounding cursor 1470. More specifically, the width of the spectrum time 1419 is used to create the spectrum trace 1544, except the spectrum time width is centered about cursor 1470. Additionally, cursor indicators 1571 and 1573 appear on the spectrogram 1450 at the same relative positions in the spectrogram as they appear in the waveform display 1410. Recall from above that the spectrogram 1450 has a time domain component along the Y-axis. The position of the cursor indicators 1571 and 1573 in the spectrogram 1450 are correlated with their positions in the time domain of the waveform display 1410. In this way, the presence of the cursor indicators 1571 and 1573 allow a user to highlight particular portions of the spectrogram 1450. And, when the user changes the positions of the cursors 1470, 1472 in the waveform display 1410, as described above, the position of the cursor indicators 1571 and 1573 are likewise respectively repositioned to their new positions. As the resolution of the time axis in the spectrogram 1450 may not be as precise as the resolution of the time axis on the waveform display 1410, small movements of the waveform cursors 1470, 1472 may not cause any movement of the cursor indicators 1571 and 1573.

Furthermore, in these embodiments, the spectrum trace 1544 is likewise updated in real time, as the cursor 1470 is repositioned in the waveform display 1410. Whether to enable spectrum traces for either or both of the cursors 1470, 1472, is user selectable. While FIG. 15 shows only the spectrum trace 1544, corresponding to the waveform cursor 1470, is enabled, FIG. 16 shows a display screen 1600 where both spectrum traces 1544 and 1646, which correspond to both waveform cursors 1470 and 1472, are enabled in a spectral display 1640. As described above, any number of cursors may be enabled in the waveform display 1410, and all of the cursors enabled on the waveform display may be individually selected to be displayed or not, in the corresponding spectral display 1640.

Accordingly, by providing cursor functionality in a user interface, these embodiments of the disclosure provide a user with the ability to easily and intuitively view and compare multiple spectrums from different areas of a single acquisition by controlling the user interface. Also, the cursors may be enabled in displays including the zoom view described above with reference to FIGS. 11-13

Figure 17:
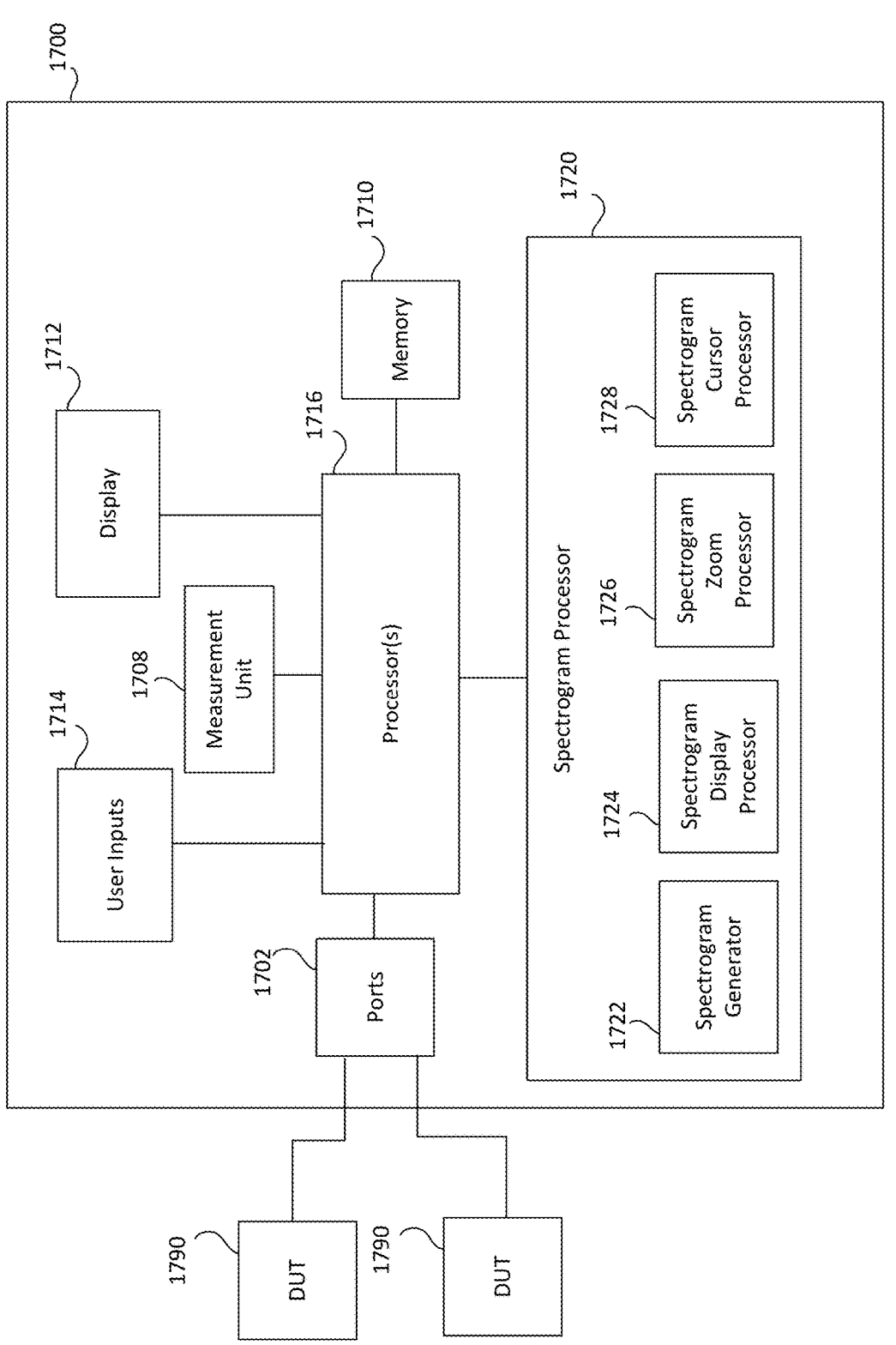
FIG. 17 is a block diagram of an instrument that includes automatic determination of spectrum and spectrogram attributes, according to embodiments of the disclosure.

Embodiment of the disclosure operate on particular hardware and/or software to implement the above-described operations. FIG. 17 is a block diagram of an example test and measurement instrument 1700, such as an oscilloscope or spectrum analyzer for implementing embodiments of the disclosure disclosed herein. The test and measurement instrument 1700 includes one or more ports 1702, which may be any electrical signaling medium. The ports 1702 may include receivers, transmitters, and/or transceivers. Each port 1702 is a channel of the test and measurement instrument 1700. The ports 1702 are coupled with one or more processors 1716 to process the signals and/or waveforms received at the ports 1702 from one or more devices under test (DUTs) 1790. Although only one processor 1716 is shown in FIG. 17 for ease of illustration, as will be understood by one skilled in the art, multiple processors 1716 of varying types may be used in combination in the instrument 1700, rather than a single processor 1716.

The ports 1702 can also be connected to a measurement unit 1708 in the test instrument 1700. The measurement unit 1708 can include any component capable of measuring aspects (e.g., voltage, amperage, amplitude, energy, etc.) of a signal received via ports 1702. The test and measurement instrument 1700 may include additional hardware and/or processors, such as conditioning circuits, analog to digital converters, and/or other circuitry to convert a received signal to a waveform for further analysis. The resulting waveform can then be stored in a memory 1710, as well as displayed on a display 1712.

The one or more processors 1716 may be configured to execute instructions from the memory 1710 and may perform any methods and/or associated steps indicated by such instructions, such as displaying and modifying the input signals received by the instrument. The memory 1710 may be implemented as processor cache, random access memory (RAM), read only memory (ROM), solid state memory, hard disk drive(s), or any other memory type. The memory 1710 acts as a medium for storing data, computer program products, and other instructions.

User inputs 1714 are coupled to the processor 1716. User inputs 1714 may include a keyboard, mouse, touchscreen, and/or any other controls employable by a user to set up and control the instrument 1700. User inputs 1714 may include a graphical user interface or text/character interface operated in conjunction with the display 1712. User inputs 1714 may further include programmatic inputs from the user on the instrument 1700, or from a remote device. The display 1712 may be a digital screen, a cathode ray tube based display, or any other monitor to display waveforms, measurements, and other data to a user. While the components of test instrument 1700 are depicted as being integrated within test and measurement instrument 1700, it will be appreciated by a person of ordinary skill in the art that any of these components can be external to test instrument 1700 and can be coupled to test instrument 1700 in any conventional manner (e.g., wired and/or wireless communication media and/or mechanisms). For example, in some embodiments, the display 1712 may be remote from the test and measurement instrument 1700, or the instrument may be configured to send output to a remote device in addition to displaying it on the instrument 1700. In further embodiments, output from the measurement instrument 1700 may be sent to or stored in remote devices, such as cloud devices, that are accessible from other machines coupled to the cloud devices.

The instrument 1700 may include a spectrogram processor 1720, which may be a separate processor from the one or more processors 1716 described above, or the functions of the spectrogram processor 1720 may be integrated into the one or more processors 1716. Additionally, the spectrogram processor 1720 may include separate memory, use the memory 1710 described above, or any other memory accessible by the instrument 1700. The spectrogram processor 1720 may include specialized processors to implement the functions described above. For example, the spectrogram processor 1720 may include a spectrogram generator 1722 used to generate the spectrogram using procedures and operations described above to implement spectrogram generation. A spectrogram display processor 1724 may generate the spectrogram displays to be shown on the display 1712, and may control updating the spectrogram display in real time or near-real time as elements of the display are manipulated by the user, or as the input signal from a DUT 1790 changes. A spectrogram zoom processor 1726 controls the zooming functions and operations as described above, and may work in conjunction with the spectrogram generator 1722 to update the spectrograms in real time or near-real time as zoom controls are modified. Finally, a spectrogram cursor processor 1728 may specifically control creation and operation of the waveform cursors as described in detail above. Any or all of the components of the spectrogram processor 1720, including the spectrogram generator 1722, spectrogram display processor 1724, spectrogram zoom processor 1726, and/or spectrogram cursor processor 1728 may be embodied in one or more separate processors, and the separate functionality described herein may be implemented as specific pre-programmed operations of a special purpose or general purpose processor. Further, as stated above, any or all of the components or functionality of the spectrogram processor 1720 may be integrated into the one or more processors 1716 that operate the instrument 1700.

Further, particular aspects of the disclosure may operate on a particularly created hardware, on firmware, digital signal processors, or on a specially programmed general purpose computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

EXAMPLES

Illustrative examples of the disclosed technologies are provided below. An embodiment of the technologies may include one or more, and any combination of, the examples described below.

Example 1 is a test and measurement instrument, including a spectrogram generator for producing a first spectrogram image from an input signal; a display for showing the spectrogram image; a user interface operating in conjunction with the display, the user interface including one or more user controllable inputs and the user interface configured to detect a user action; and the spectrogram generator structured to produce a second spectrogram image, different from the first spectrogram image, based on the detected user action by the user interface.

Example 2 is a test and measurement instrument according to Example 1, in which the second spectrogram image has a different time resolution than the first spectrogram image.

Example 3 is a test and measurement instrument according to any of the preceding Examples, in which the second spectrogram image has a different number of vertical rows than the first spectrogram image.

Example 4 is a test and measurement instrument according to any of the preceding Examples, in which the user interface is a graphical user interface, and in which the user action is moving an element presented on the display from a first location to a second location on the display.

Example 5 is a test and measurement instrument according to any of the preceding Examples, in which the user interface is a graphical user interface, and in which the user action is changing a size of a window on the display in which the first spectrogram image is displayed.

Example 6 is a test and measurement instrument according to any of the preceding Examples, in which the user interface is a character interface, and in which the user action is specifying a size of a window on the display in which the first spectrogram image is displayed by entering a value in the character interface.

Example 7 is a test and measurement instrument according to any of the preceding Examples, in which the first spectrogram is generated from one or more spectrum blocks, where each of the one or more spectrum blocks specifies pixel values for a respective row of pixels making up the first spectrogram.

Example 8 is a test and measurement instrument according to Example 7, in which the one or more spectrum blocks are generated from an acquisition sample, and in which data from the acquisition sample overlaps two adjacent spectrum blocks.

Example 9 is a test and measurement instrument according to Example 8, in which the second spectrogram image has a different degree of overlap between two adjacent spectrum blocks used in generating the second spectrogram image than a degree of overlap between two adjacent spectrum blocks used in generating the first spectrogram image.

Example 10 is a test and measurement instrument according to any of the preceding Examples, in which the spectrogram image appears in a first window of the display having frequency as a horizontal axis, and further comprising a waveform view in a second window of the display having time as a horizontal axis.

Example 11 is a test and measurement instrument according to Example 10, further comprising a zoom window overlayed on the waveform view, in which a portion of the input signal is excluded from the zoom window.

Example 12 is a test and measurement instrument according to Example 11, in which the user action comprises selecting the zoom window to be overlayed on the waveform view.

Example 13 is a test and measurement instrument according to Example 11, in which the user action comprises adjusting a size of the zoom window.

Example 14 is a test and measurement instrument according to Example 12, in which the second spectrogram image is produced only from a portion of the input signal that is included within the zoom window.

Example 15 is a method in a test and measurement instrument including a display, the method including generating a first spectrogram image on the display from an input signal acquired by the test and measurement instrument in a display window having a first window size, accepting input from the user to adjust the first window size to a second window size different than the first window size, and automatically generating a second spectrogram image on the display from the input signal acquired by the test and measurement instrument to fill the second window based on the input from the user.

Example 16 is a method according to Example 15, in which each row of the first spectrogram image is produced from an individual spectral block, and in which automatically generating the second spectrogram image comprises modifying the first spectrogram image by changing an amount of data from the input signal that is overlapped between two adjacent spectrum blocks.

Example 17 is a method according to any of the preceding Examples, in which automatically generating the second spectrogram image comprises generating a second spectrogram image that has a different time resolution than the first spectrogram image.

Example 18 is a method according to any of the preceding Examples, in which accepting input from the user to adjust the first window size comprises detecting that the user has moved an element presented on the display from a first location to a second location on the display.

Example 19 is a method according to any of the preceding Examples, further comprising displaying a zoom window on the display that selects only a portion of the input signal.

Example 20 is a method according to Example 19, further comprising automatically generating the second spectrogram image on the display based only from the portion of the input signal selected within the zoom window.

The previously described versions of the disclosed subject matter have many advantages that were either described or would be apparent to a person of ordinary skill. Even so, these advantages or features are not required in all versions of the disclosed apparatus, systems, or methods.

Also, when reference is made in this application to a method having two or more defined steps or operations, the defined steps or operations can be carried out in any order or simultaneously, unless the context excludes those possibilities.

Additionally, this written description makes reference to particular features. It is to be understood that the disclosure in this specification includes all possible combinations of those particular features. Where a particular feature is disclosed in the context of a particular aspect or example, that feature can also be used, to the extent possible, in the context of other aspects and examples.

All features disclosed in the specification, including the claims, abstract, and drawings, and all the steps in any method or process disclosed, may be combined in any combination, except combinations where at least some of such features and/or steps are mutually exclusive. Each feature disclosed in the specification, including the claims, abstract, and drawings, can be replaced by alternative features serving the same, equivalent, or similar purpose, unless expressly stated otherwise.

Although specific examples of the invention have been illustrated and described for purposes of illustration, it will be understood that various modifications may be made without departing from the spirit and scope of the invention. Accordingly, the invention should not be limited except as by the appended claims.

We claim:

1. A test and measurement instrument, comprising:

a spectrogram generator for producing a first spectrogram image from an input signal, the first spectrogram image illustrating a frequency of the input signal on a first axis versus time of the input signal on a second axis, in which the first spectrogram is generated from one or more spectrum blocks, where each of the one or more spectrum blocks specifies pixel values for a respective row of pixels making up the first spectrogram, in which the one or more spectrum blocks are generated from an acquisition sample, and in which data from the acquisition sample overlaps two adjacent spectrum blocks;

a display for showing the first spectrogram image;

a user interface operating in conjunction with the display, the user interface including one or more user controllable inputs and the user interface configured to detect a user action; and the spectrogram generator structured to produce a modified spectrogram image, different from the first spectrogram image, based on the detected user action by the user interface, and in which the modified spectrogram image has a different degree of overlap between two adjacent spectrum blocks used in generating the modified spectrogram image than a degree of overlap between two adjacent spectrum blocks used in generating the first spectrogram image.

2. The test and measurement instrument according to claim 1, in which the modified spectrogram image has a different time resolution than the first spectrogram image.

3. The test and measurement instrument according to claim 1, in which the modified spectrogram image has a different number of vertical rows than the first spectrogram image.

4. The test and measurement instrument according to claim 1, in which the user interface is a graphical user interface, and in which the user action is moving an element presented on the display from a first location to a second location on the display.

5. The test and measurement instrument according to claim 1, in which the user interface is a graphical user interface, and in which the user action is changing a size of a window on the display in which the first spectrogram image is displayed.

6. The test and measurement instrument according to claim 1, in which the user interface is a character interface, and in which the user action is specifying a size of a window on the display in which the first spectrogram image is displayed by entering a value in the character interface.

7. The test and measurement instrument according to claim 1, in which the first spectrogram image appears in a first window of the display having frequency as a horizontal axis, and further comprising a waveform view in a second window of the display having time as a horizontal axis.

8. The test and measurement instrument according to claim 7, further comprising a zoom window overlayed on the waveform view, in which a portion of the input signal is excluded from the zoom window.

9. The test and measurement instrument according to claim 8, in which the user action comprises selecting the zoom window to be overlayed on the waveform view.

10. The test and measurement instrument according to claim 9, in which the modified spectrogram image is produced only from a portion of the input signal that is included within the zoom window.

11. The test and measurement instrument according to claim 8, in which the user action comprises adjusting a size of the zoom window.

12. The test and measurement instrument according to claim 1, in which the user interface is a graphical interface, and in which the user action is changing a resolution of the first spectrogram image.

13. A method in a test and measurement instrument including a display, the method comprising:

generating a first spectrogram image on the display from an input signal acquired by the test and measurement instrument in a display window having a first window size, the first spectrogram image illustrating a frequency of the input signal on a first axis versus time of the input signal on a second axis;

accepting input from the user to adjust the first window size to a second window size different than the first window size; and automatically generating a modified spectrogram image on the display from the input signal acquired by the test and measurement instrument to fill the second window based on the input from the user, in which each row of the first spectrogram image is produced from an individual spectral block, and in which automatically generating the modified spectrogram image comprises modifying the first spectrogram image by changing an amount of data from the input signal that is overlapped between two adjacent spectrum blocks.

14. The method according to claim 13, in which automatically generating the modified spectrogram image comprises generating a second spectrogram image that has a different time resolution than the first spectrogram image.

15. The method according to claim 13, in which accepting input from the user to adjust the first window size comprises detecting that the user has moved an element presented on the display from a first location to a second location on the display.

16. The method according to claim 13, further comprising displaying a zoom window on the display that selects only a portion of the input signal.

17. The method according to claim 16, further comprising automatically generating the modified spectrogram image on the display based only from the portion of the input signal selected within the zoom window.

18. The method according to claim 13, further comprising changing a resolution of the first spectrogram image based on the input from the user.

* * * * *